US012672492B2

(12) United States Patent
Dole et al.

(10) Patent No.: US 12,672,492 B2
(45) Date of Patent: Jun. 30, 2026

(54) SYSTEMS AND METHODS FOR ETCHING A HIGH ASPECT RATIO STRUCTURE

(71) Applicant: Lam Research Corporation, Fremont, CA (US)

(72) Inventors: Nikhil Dole, Castro Valley, CA (US); Takumi Yanagawa, Fremont, CA (US); Eric A. Hudson, Berkeley, CA (US); Merrett Wong, San Carlos, CA (US); Aniruddha Joi, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 696 days.

(21) Appl. No.: 18/011,837

(22) PCT Filed: Dec. 22, 2021

(86) PCT No.: PCT/US2021/065019
§ 371 (c)(1),
(2) Date: Dec. 22, 2022

(87) PCT Pub. No.: WO2022/265673
PCT Pub. Date: Dec. 22, 2022

(65) Prior Publication Data
US 2024/0120209 A1    Apr. 11, 2024

Related U.S. Application Data

(60) Provisional application No. 63/212,095, filed on Jun. 17, 2021.

(51) Int. Cl.
*H10P 50/28*        (2026.01)
*H01J 37/32*        (2006.01)
(Continued)

(52) U.S. Cl.
CPC ...... *H10P 50/283* (2026.01); *H01J 37/32082* (2013.01); *H01J 37/32449* (2013.01);
(Continued)

(58) Field of Classification Search
None
See application file for complete search history.

(56) References Cited

U.S. PATENT DOCUMENTS 9,673,058 B1    6/2017 Briggs et al.
2006/0040415 A1    2/2006 Chou et al.
(Continued)

FOREIGN PATENT DOCUMENTS

KR    2006-0079378 A    7/2006

OTHER PUBLICATIONS

ISR & WO PCT/US2021/065019, dated Apr. 18, 2022, 9 pages.

*Primary Examiner* — Binh X Tran
(74) *Attorney, Agent, or Firm* — Polygon IP, LLP

(57)    ABSTRACT

A method for etching a stack is described. The method includes etching a first nitrogen-containing layer of the stack by applying a non-metal gas and discontinuing the application of the non-metal gas upon determining that a first oxide layer is reached. The first oxide layer is under the first nitrogen-containing layer. The method further includes etching the first oxide layer by applying a metal-containing gas. The application of the metal-containing gas is discontinued upon determining that a second nitrogen-containing layer will be reached. The second nitrogen-containing layer is situated under the first oxide layer. The method includes etching the second nitrogen-containing layer by applying the non-metal gas.

25 Claims, 9 Drawing Sheets

(51) Int. Cl.
 *H10P 50/26* (2026.01)
 *H10P 72/00* (2026.01)

(52) U.S. Cl.
 CPC ........ *H10P 50/268* (2026.01); *H10P 72/0421*
 (2026.01); *H10P 72/0604* (2026.01); *H01J*
 *2237/327* (2013.01); *H01J 2237/3341*
 (2013.01)

(56) References Cited

U.S. PATENT DOCUMENTS

2018/0076048 A1* 3/2018 Gohira .............. H01L 21/31116
2019/0393047 A1* 12/2019 Dole ................. H01L 21/31144
2021/0358717 A1* 11/2021 Kim ..................... H01J 37/3211

* cited by examiner

100

| |
|---|
| Mask Layer |
| Nitrogen-containing Layer 1 |
| Oxide 1 |
| Nitrogen-containing Layer 2 |
| Oxide 2 |
| Nitrogen-containing Layer 3 |
| Substrate Layer |

(DRAM)

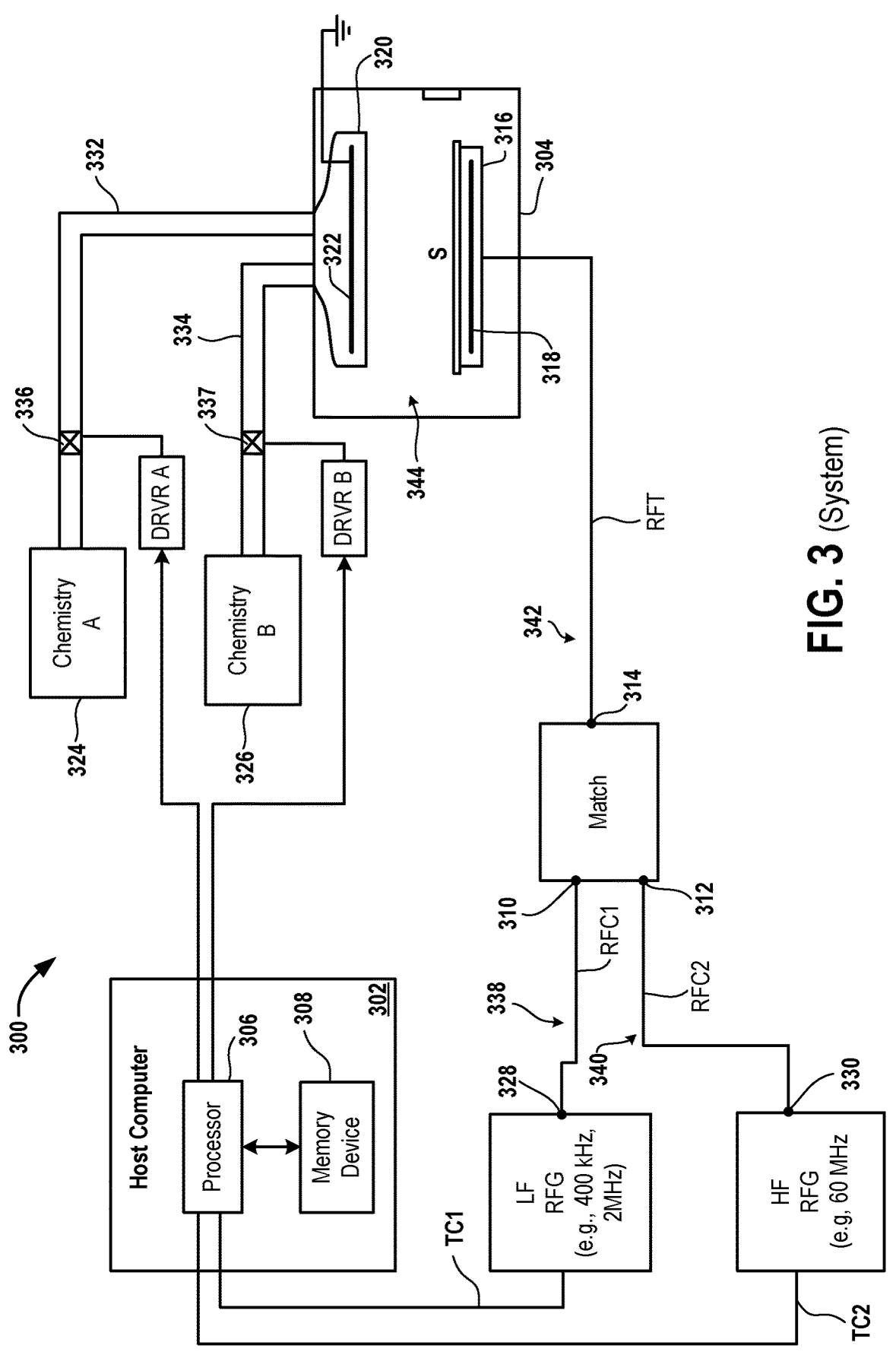
FIG. 3 (System)

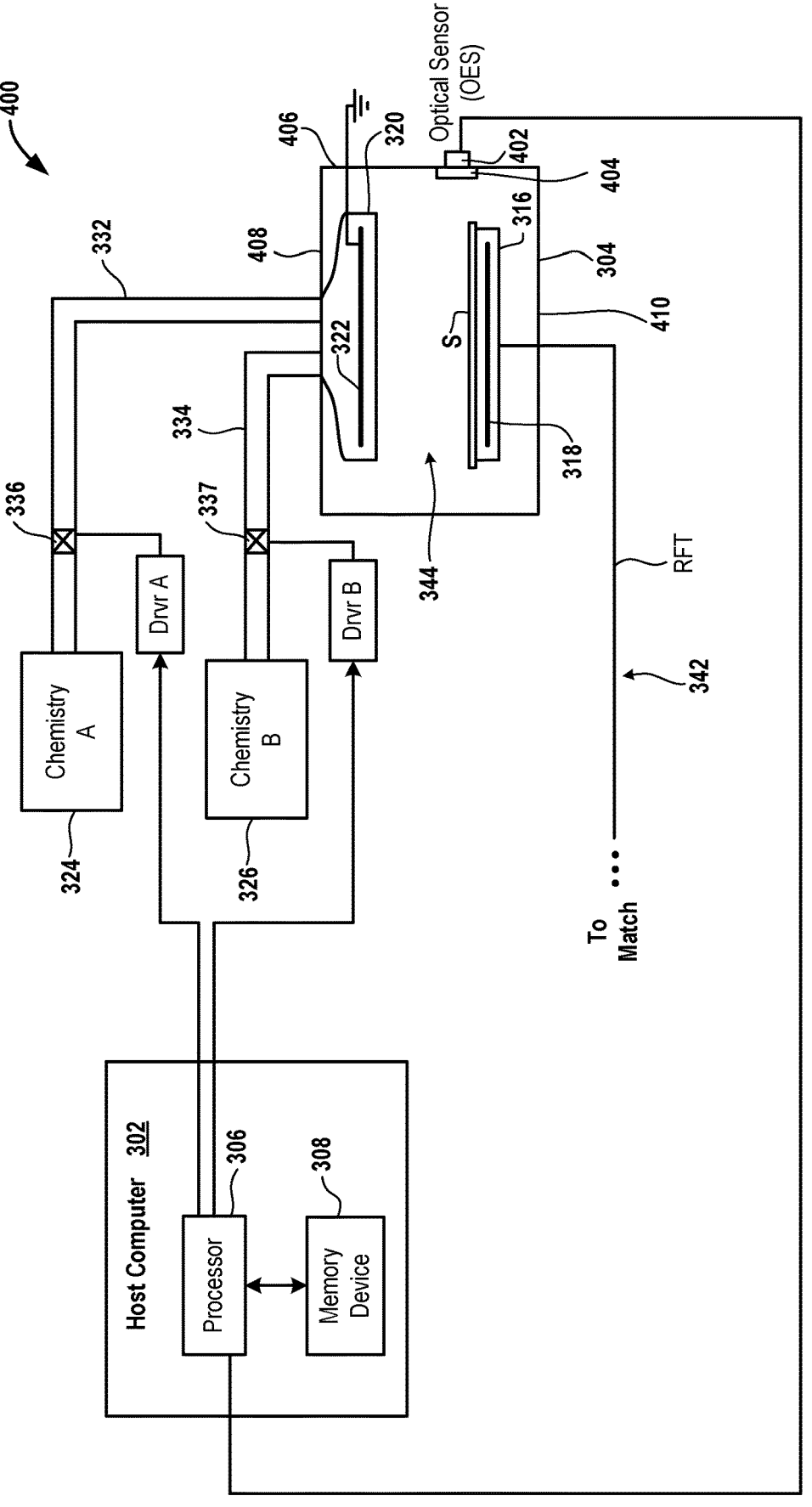
FIG. 4A (Endpoint Detection System)

450

| Light Intensity Range | Layer |
|---|---|
| Light Intensity Range 1 | Nitrogen-containing Layer |
| Light Intensity Range 2 | Oxide Layer |

Memory Device 308

452

Processor
306

(Intensity)

(LF RFG)

(HF RFG)

SYSTEMS AND METHODS FOR ETCHING A HIGH ASPECT RATIO STRUCTURE

CLAIM OF PRIORITY

This application is a national stage filing of and claims priority, under 35 U.S.C. § 371, to PCT/US21/65019, filed on Dec. 22, 2021, and titled "SYSTEMS AND METHODS FOR ETCHING A HIGH ASPECT RATIO STRUCTURE", which claims the benefit of and priority, under 35 U.S.C. § 119(e), to U.S. Provisional Patent Application No. 63/212, 095, filed on Jun. 17, 2021, all of which are incorporated by reference herein in their entirety.

FIELD

The embodiments described in the present disclosure relate to systems and methods for etching a high aspect ratio structure.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radiofrequency (RF) generator generates an RF signal and supplies the RF signal via a match to a plasma reactor. The plasma reactor has a semiconductor wafer that is etched when the RF signal is supplied and an etchant gas is supplied to the plasma reactor. However, a desirable etch rate associated with the semiconductor wafer is not achieved while the semiconductor wafer is etched.

It is in this context that embodiments described in the present disclosure arise.

SUMMARY

Embodiments of the disclosure provide apparatus, methods and computer programs for etching a high aspect ratio structure. It should be appreciated that the present embodiments can be implemented in numerous ways, e.g., a process, an apparatus, a system, a piece of hardware, or a method on a computer-readable medium. Several embodiments are described below.

A metal-containing chemistry is used for etching the high aspect ratio structure, such as a dynamic random access memory stack. The metal-containing chemistry can show an improvement in mask remaining budget during the etch of a high aspect ratio feature. However, when the metal-containing chemistry is used for etching a nitrogen-containing layer of the high aspect ratio structure, under etching of the nitrogen-containing layer or an etch stop at the nitrogen-containing layer occurs. For example, the nitrogen-containing layer is etched at less than a pre-determined etch rate or is not etched.

In an embodiment, a method for etching a stack is described. The method includes etching a first nitrogen-containing layer of the stack by applying a non-metal gas and discontinuing the application of the non-metal gas upon determining that a first oxide layer is reached. The first oxide layer is under the first nitrogen-containing layer. The method further includes etching the first oxide layer by applying a metal-containing gas. The application of the metal-containing gas is discontinued upon determining that a second nitrogen-containing layer will be reached. The second nitrogen-containing layer is situated under the first oxide layer. The method includes etching the second nitrogen-containing layer by applying the non-metal gas.

In one embodiment, a controller for etching a stack is described. The controller includes a processor, which controls application of a non-metal gas to etch a first nitrogen-containing layer of the stack. The processor thereafter discontinues the application of the non-metal gas upon determining that a first oxide layer is reached. The first oxide layer is under the first nitrogen-containing layer. The processor further controls etching of the first oxide layer by applying a metal-containing gas. The processor then discontinues the application of the metal-containing gas upon determining that a second nitrogen-containing layer will be reached. The second nitrogen-containing layer is situated under the first oxide layer. The processor further controls etching the second nitrogen-containing layer by applying the non-metal gas. The controller also includes a memory device coupled to the processor.

In an embodiment, a plasma system for etching a stack is described. The plasma system includes a first gas source that stores a metal-containing gas. The plasma system further includes a second gas source that stores a non-metal gas. The plasma system includes a plasma chamber coupled to the first gas source via a first gas line and to the second gas source via a second gas line. The plasma system also includes a host computer coupled to the first and second gas lines. The host computer controls etching of a first nitrogen-containing layer of the stack by applying the non-metal gas. The host computer then discontinues the application of the non-metal gas upon determining that a first oxide layer is reached. The host computer further controls etching of the first oxide layer by applying the metal-containing gas. The host computer discontinues the application of the metal-containing gas upon determining that a second nitrogen-containing layer will be reached. The host computer then controls etching of the second nitrogen-containing layer by applying the non-metal gas.

Some advantages of the herein described systems and methods for etching the high aspect ratio structure include using a non-metal gas to etch a nitrogen-containing layer of the high aspect ratio structure and a metal-containing gas to etch an oxide layer of the high aspect ratio structure. The oxide layer is etched according to a pre-determined rate by using the metal-containing gas. By using the non-metal gas instead of the metal-containing gas to etch the nitrogen-containing layer, the pre-determined etch rate for etching the high aspect ratio structure is achieved.

Further advantages of the herein described systems and methods for etching the high aspect ratio structure include pulsing parameter levels of a primary radio frequency (RF) signal and a secondary RF signal according to a pre-determined ratio. An example of the primary RF signal is a low frequency (LF) RF signal and an example of the secondary RF signal is a high frequency (HF) RF signal. By achieving the pre-determined ratio, deposition from passivation is driven more towards top portions of features compared to bottom portions of the features. By driving the deposition in such a manner, chances of under etching of the nitrogen-containing layer of the high aspect ratio structure are reduced.

Some other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 3 is a diagram of an embodiment of a system to illustrate an application of chemistries A and B to the high aspect ratio structure of FIG. 1.

FIG. 4A is a diagram of an embodiment of a system to illustrate use of an optical sensor to determine times at which to switch between application of the chemistry A and application of the chemistry B.

DETAILED DESCRIPTION

The following embodiments describe systems and methods for etching a high aspect ratio structure. It will be apparent that the present embodiments may be practiced without some or all of these specific details. In other instances, well known process operations have not been described in detail in order not to unnecessarily obscure the present embodiments.

Figure 1:
FIG. 1 is a diagram of an embodiment of a high aspect ratio contact (high aspect ratio) structure.

FIG. 1 is a diagram of an embodiment of a high aspect ratio structure 100. Examples of the high aspect ratio structure 100 include a dynamic random access memory stack and a silicon-oxide-nitride-oxide-silicon (SONOS) stack. As an example, in a dynamic random access memory, each bit of data is stored in a memory cell that includes a capacitor and a transistor. In the example, when the capacitor is charged, a bit 1 is stored in the memory cell and when discharged, a bit 0 is stored in the memory cell. As an example, the SONOS stack is used in a non-volatile memory, such as a flash memory and an electrically erasable programmable read-only memory (EEPROM).

The high aspect ratio structure 100 includes a mask layer, a nitrogen-containing layer 1, an oxide layer 1, another nitrogen-containing layer 2, another oxide layer 2, a nitrogen-containing layer 3, and a substrate layer. As an example, the alternative arrangement of the nitrogen-containing and oxide layers of the high aspect ratio structure forms a dielectric layer of each capacitor of the high aspect ratio structure and the nitrogen-containing and oxide layers are etched to fabricate the capacitor of the high aspect ratio structure. As an example, the substrate layer is fabricated from silicon. As shown, the nitrogen-containing layer 3 is overlaid on top of the substrate layer and the oxide layer 2 is overlaid on top of the nitrogen-containing layer 3. Moreover, the nitrogen-containing layer 2 is deposited on top of the oxide layer 2 and the oxide layer 1 is deposited on top of the nitrogen-containing layer 2. Also, the nitrogen-containing layer 1 is overlaid on top of the oxide layer 1, and the mask layer is deposited on top of the nitrogen-containing layer 1. For example, the nitrogen-containing layer 1 is adjacent to the oxide layer 1, which is adjacent to the nitrogen-containing layer 2. The nitrogen-containing layer 2 is adjacent to the oxide layer 2 and the oxide layer 2 is adjacent to the nitrogen-containing layer 3. The nitrogen-containing layer 3 is adjacent to the substrate layer and the mask layer is adjacent to the nitrogen-containing layer 1. To illustrate, two layers, such as the nitrogen-containing layer 1 and the oxide layer 1 or the oxide layer 1 and the nitrogen-containing layer 2, of the high aspect ratio structure 100 are adjacent to each other when there is no layer between the two layers.

An example of a nitrogen-containing layer, as described herein, is a nitrogen-containing film that is fabricated from silicon nitride (SiN), or silicon carbide-nitride (SiCN), or silicon oxynitride (SiON), or a combination thereof. To illustrate, the nitrogen-containing layer is sometimes referred to herein as a nitrogen-containing-silicon layer or a nitride layer. As an example, each nitrogen-containing layer of the high aspect ratio structure 100 has a height that ranges from 15 nanometers (nm) to 300 nm. To illustrate, a thickness of the nitrogen-containing layer 1 is 30 nm, the thickness of the nitrogen-containing layer 2 is 50 nm, and a thickness of the nitrogen-containing layer 3 is 60 nm. As an example, each oxide layer of the high aspect ratio structure 100 has a height that ranges from 15 nm to 300 nm. To illustrate, a thickness of the oxide layer 1 is 100 nm and a thickness of the oxide layer 2 is 200 nm.

In one embodiment, instead of the nitrogen-containing layer, a silicon-containing layer, such as a polysilicon (P) layer or a nitrogen-silicon layer is used. For example, each nitrogen-containing layer 1, 2, and 3 in the high aspect ratio stack 100 is replaced with a respective silicon-containing layer. The silicon-containing layers are etched in the same manner in which the nitrogen-containing layers 1, 2, and 3 are etched. For example, a first silicon-containing layer used in place of the nitrogen-containing layer 1 is etched in the same manner in which the nitrogen-containing layer 1 is etched, a second silicon-containing layer used in place of the nitrogen-containing layer 2 is etched in the same manner in which the nitrogen-containing layer 2 is etched, and a third silicon-containing layer used in place of the nitrogen-containing layer 3 is etched in the same manner in which nitrogen-containing layer 3 is etched. An example of the nitrogen-silicon layer is a silicon nitride layer.

Figure 2A:
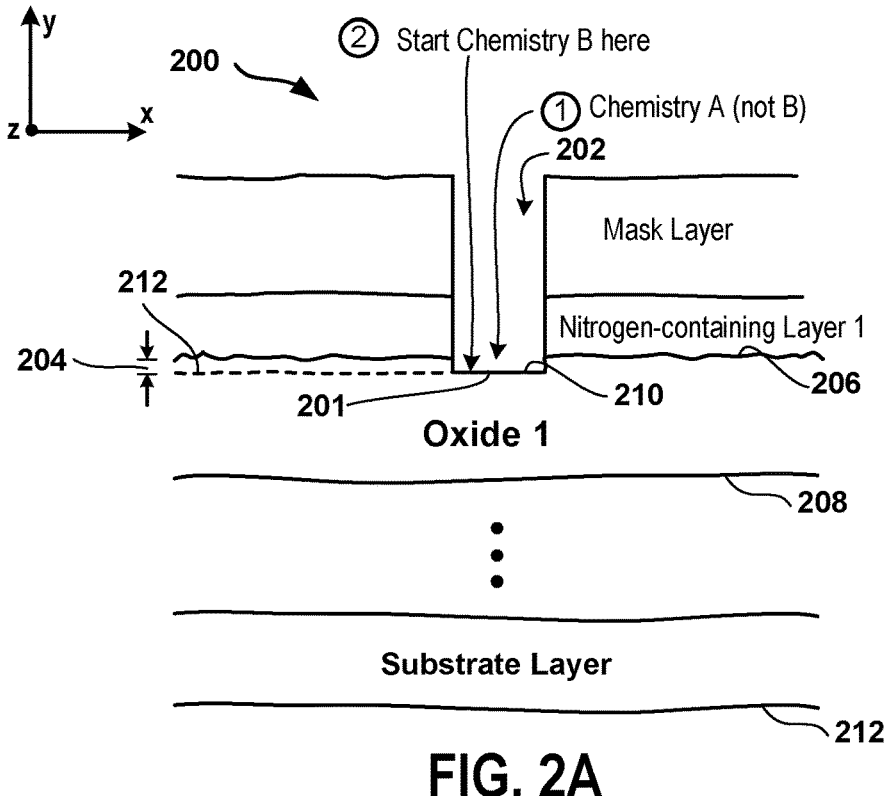
FIG. 2A is a diagram of an embodiment of a high aspect ratio structure to illustrate processing of the high aspect ratio structure of FIG. 1.

FIG. 2A is a diagram of an embodiment of a high aspect ratio structure 200 to illustrate processing of the high aspect ratio structure 100 (FIG. 1). The high aspect ratio structure 200 includes the same layers as the high aspect ratio structure 100 (FIG. 1) except that in the high aspect ratio structure 200, the mask layer and the nitrogen-containing layer 1 are etched to form a feature 202, such as a channel, within the mask layer and the nitrogen-containing layer 1.

The remaining layers of the high aspect ratio structure 100 are not shown in FIG. 2A to not clutter FIG. 2A.

To etch the mask layer and the nitrogen-containing layer 1, a chemistry A is applied. An example of the chemistry A includes a non-metal gas, such as a hydrofluorocarbon or oxygen. Examples of hydrofluorocarbon include difluoromethane ($CH_2F_2$), methyl fluoride ($CH_3F$), and trifluoromethane ($CHF_3$). The chemistry A is applied to etch the nitrogen-containing layer 1 until a horizontal level 212 is reached within the oxide layer 1. As an example, a horizontal level is a level along an x-axis. The horizontal level 212 is at a pre-determined depth 204 from a top surface 206 of the oxide layer 1. For example, a recess 201 of a pre-set height is punched within the oxide layer 1. The recess 201 is a portion of the feature 202. As described herein, a height is measured along a y-axis. The y-axis is perpendicular to the x-axis, which lies along a horizontal direction. The y-axis lies along a vertical direction. Both the x and y axes are perpendicular to a z-axis.

The pre-determined depth 204 is determined from a top surface 206 of the oxide layer 1. An example of the pre-determined depth 204 is a vertical distance that is approximately 50 nm. To illustrate, the pre-determined depth 204 ranges from 40 nm to 60 nm. As another example, the pre-determined depth 204 ranges from 45 nm to 55 nm. As yet another example, the pre-determined depth 204 is a fraction of a depth of the oxide layer 1. To illustrate, the pre-determined depth 204 is between 1 to 10 percent of the depth of the oxide layer 1. The depth of the oxide layer 1 extends from the top surface 206 to a bottom surface 208 of the oxide layer 1. As an example, as used herein, a depth of a layer extends along the y-axis.

Within the feature 202, when the horizontal level 212 is reached, an intermediate surface 210 of the oxide layer 1 is exposed. The intermediate surface 210 forms a bottom surface of the feature 202. When the horizontal level 212 is reached, the recess 201 having a space is formed within the oxide layer 1. For example, the recess 201 is formed between the top surface 206 and the intermediate surface 210, and has the pre-determined depth 204. The intermediate surface 210 is located between the top surface 206 and the bottom surface 208. For example, a height of the intermediate surface 210 is less than a height of the top surface 206 but greater than a height of the bottom surface 208. To illustrate, a height of each surface of the high aspect ratio structure 200 is measured from a bottom surface 212 of the substrate layer.

When the chemistry A is used to etch the nitrogen-containing layer 1, another chemistry B is not used to etch the nitrogen-containing layer 1. For example, during a time period in which the chemistry A is applied to etch the nitrogen-containing layer 1, the chemistry B is not applied to etch the nitrogen-containing layer 1. An example of the chemistry B includes a metal-containing compound. As an example, the metal-containing compound is a compound that when applied with sufficient vapor pressure, results in a gaseous delivery to the high aspect ratio structure 100. An example of the metal-containing compound is a metal-containing gas, such as a carbonyl or a metal fluoride. To illustrate, the metal fluoride is tungsten hexafluoride ($WF_6$). In the example, the metal-containing gas is applied with a fluorocarbon and nitrogen trifluoride ($NF_3$). In the illustration, the fluorocarbon is a compound that is formed by replacing one or more hydrogen atoms in a hydrocarbon with one or more fluorine atoms. Other examples of the metal-containing compound include rhenium hexafluoride ($ReF_6$), molybdenum hexafluoride ($MoF_6$), $MoCl_2F_2$, tantalum pentafluoride ($TaF_5$), vanadium fluoride ($VF_5$), vanadium oxytrichloride ($VOCl_3$), titanium tetrachloride ($TiCl_4$), plumbane ($PbH_4$), Tetramethyltin ($Sn(CH_3)_4$), nickel tetracarbonyl ($Ni(CO)_4$), dimethylzinc ($Zn(CH_3)_2$), tungsten(VI) oxytetrachloride ($WOCl_4$), bis(t-butylamido)bis(dimethylamino)tungsten(VI) ((($CH_3)_3CN)_2W(N(CH_3)_2)_2$), mesitylene tungsten tricarbonyl ($C_6H_3(CH_3)_3W(CO)_3$), tungsten (VI) oxytetrafluoride ($WOF_4$), $WO_2F_2$, and tungsten dichloride dioxide ($WO_2Cl_2$). An example of the carbonyl is tungsten hexacarbonyl ($W(CO)_6$).

It should be noted that if the chemistry B is used instead of the chemistry A, an etch stop occurs within the nitrogen-containing layer 1 or the nitrogen-containing layer 1 is under etched. When the nitrogen-containing layer 1 is under etched, an etch rate of the nitrogen-containing layer 1 is below a pre-determined etch rate.

Figure 2B:
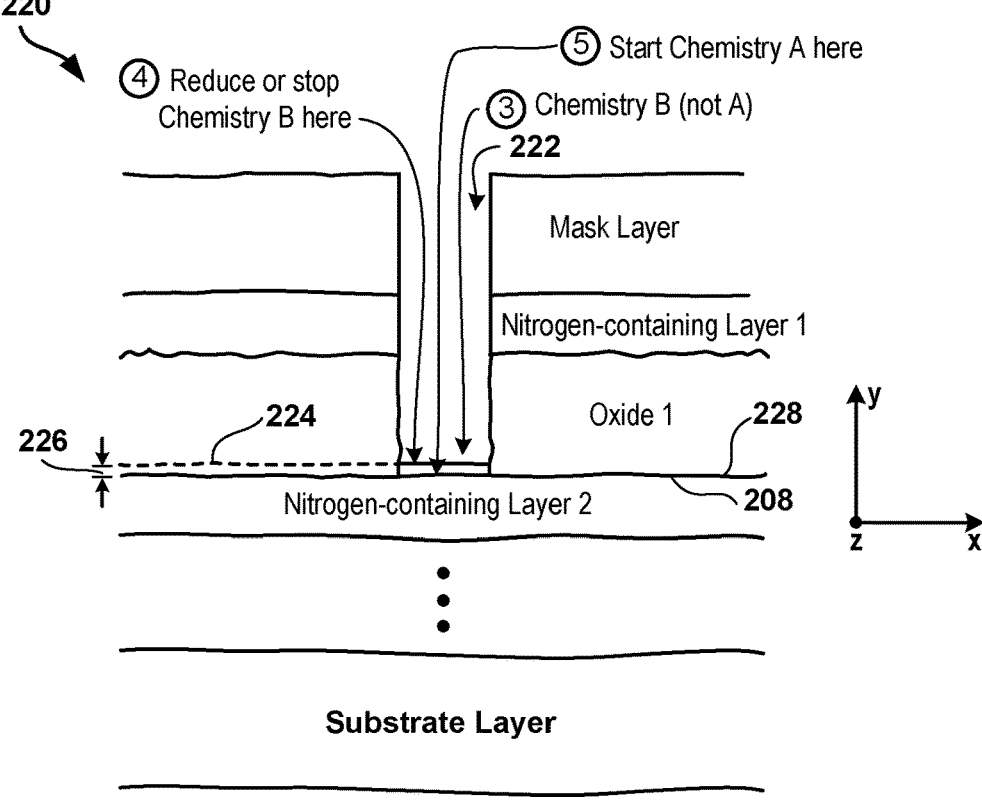
FIG. 2B is a diagram of an embodiment of a high aspect ratio structure to illustrate further processing of the high aspect ratio structure of FIG. 2A.

FIG. 2B is a diagram of an embodiment of a high aspect ratio structure 220 to illustrate further processing of the high aspect ratio structure 200 (FIG. 2A). The high aspect ratio structure 220 includes the same layers as the high aspect ratio structure 100 (FIG. 1) except that in the high aspect ratio structure 220, in addition to the mask layer and the nitrogen-containing layer 1, the oxide layer 1 is etched to form a feature 222 within the mask layer, the nitrogen-containing layer 1, and the oxide layer 1. For example, the feature 202 (FIG. 2A) is etched further to form the feature 222. The remaining layers of the high aspect ratio structure 100 are not shown in FIG. 2B to not clutter FIG. 2B.

After application of the chemistry A to etch the nitrogen-containing layer 1 is stopped, the chemistry B is applied to etch a portion of the oxide layer 1. For example, the application of the chemistry B starts at the horizontal level 212 (FIG. 2A). The chemistry B is applied until a horizontal level 224 is reached. The portion of the oxide layer 1 that is etched is located between the horizontal levels 212 and 224. An example of an amount of the portion of the oxide layer 1 that is etched is 90-95% of the oxide layer 1. The horizontal level 224 is at a preset distance 226 from a top surface 228 of the nitrogen-containing layer 2. The top surface 228 of the nitrogen-containing layer 2 is adjacent to or adjoining the bottom surface 208 of the oxide layer 1. For example, there is no space between the top surface 228 and the bottom surface 208. It should be noted that during a time period in which the chemistry B is applied to etch the oxide layer 1, the chemistry A is not being applied.

At a time at which the horizontal level 224 is reached, application of the chemistry B is reduced or stopped. If the chemistry B is reduced at a time the horizontal level 224 is reached, application of the chemistry B stops when a horizontal level of the top surface 228 of the nitrogen-containing layer 2 is reached. It should be noted that during a time period in which the chemistry B is applied to etch the oxide layer 1, the chemistry A is not applied.

After the chemistry B is stopped or reduced, any remnant chemistry B from the application of the chemistry B etches the remaining portion of the oxide layer 1 for a pre-determined time period. For example, after the chemistry B is stopped or reduced at the horizontal level 224, an oxide of the oxide layer 1 is etched by the remnant chemistry B until the nitrogen-containing layer 2 is reached.

After passage of the pre-determined time period since the application of the chemistry B is stopped or reduced, the chemistry A is applied. The chemistry A is applied to start etching the nitrogen-containing layer 2.

Figure 2C:
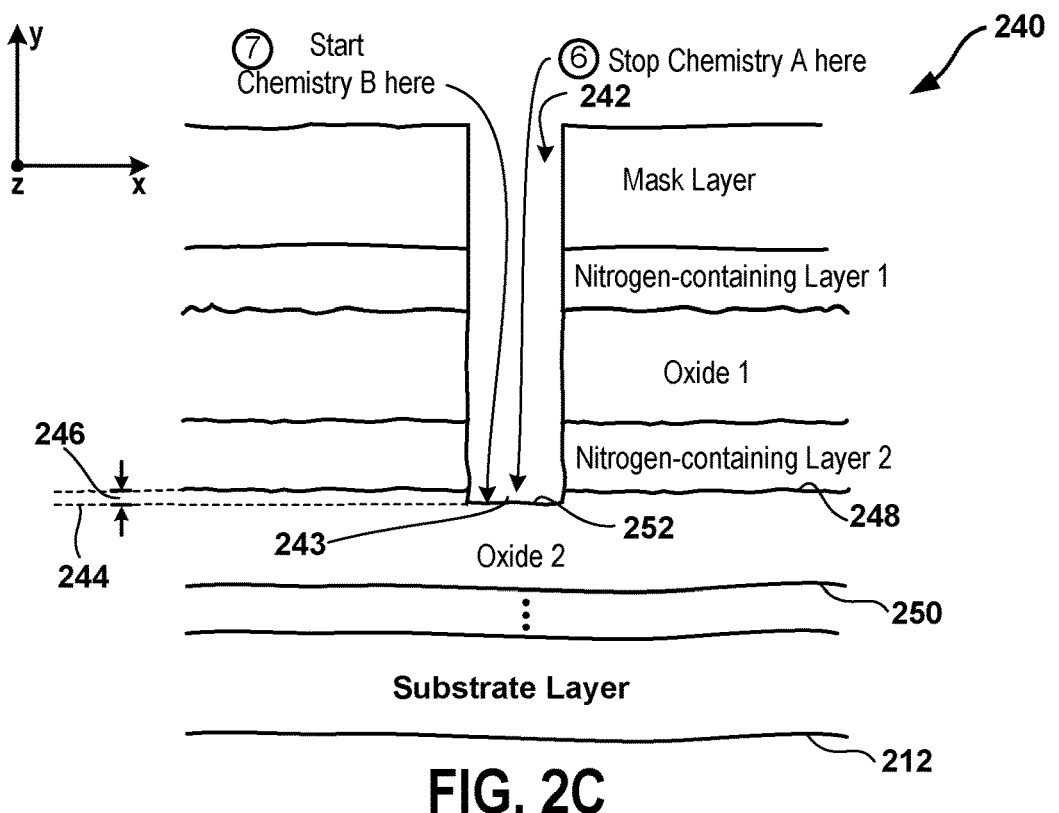
FIG. 2C is a diagram of an embodiment of a high aspect ratio structure to illustrate additional processing of the high aspect ratio structure of FIG. 2B.

FIG. 2C is a diagram of an embodiment of a high aspect ratio structure 240 to illustrate further processing of the high aspect ratio structure 220 (FIG. 2B). The high aspect ratio structure 240 includes the same layers as the high aspect ratio structure 100 (FIG. 1) except that in the high aspect ratio structure 240, in addition to the mask layer, the nitrogen-containing layer 1, and the oxide layer 1, the nitrogen-containing layer 2 is etched to form a feature 242 within the mask layer, the nitrogen-containing layer 1, the oxide layer 1, and the nitrogen-containing layer 2. For example, the feature 222 (FIG. 2B) is etched further to form the feature 242. The remaining layers of the high aspect ratio structure 100 are not shown in FIG. 2C to not clutter FIG. 2C.

The chemistry A is applied to etch the nitrogen-containing layer 2 until a recess 243 within the oxide layer 2 is formed in a manner similar to that in which the recess 201 (FIG. 2A) is formed in the oxide layer 1. For example, the chemistry A is applied to etch into the oxide layer 2 until a horizontal level 244 is reached within the oxide layer 2. The horizontal level 244 is at pre-determined depth 246 from a top surface 248 of the oxide layer 2. To illustrate, the recess of a pre-determined height is punched within the oxide layer 2. The pre-determined depth 246 is determined from the top surface 248 of the oxide layer 2.

An example of the pre-determined depth 246 is a vertical distance that is approximately 50 nm. To illustrate, the pre-determined depth 246 ranges from 40 nm to 60 nm. As another example, the pre-determined depth 246 ranges from 45 nm to 55 nm. As yet another example, the pre-determined depth 246 is a fraction of a depth of the oxide layer 2. To illustrate, the pre-determined depth 246 is between 1 to 10 percent of the depth of the oxide layer 2. The depth of the oxide layer 2 extends from the top surface 248 to a bottom surface 250 of the oxide layer 2.

As an example, the pre-determined depth 246 is equal to the pre-determined depth 204 (FIG. 2A). As another example, the pre-determined depth 246 is unequal to the pre-determined depth 204. To illustrate, the pre-determined depth 246 is greater than or less than the pre-determined depth 204.

Within the feature 242, when the horizontal level 244 is reached, an intermediate surface 252 of the oxide layer 2 is exposed. The intermediate surface 252 is located between the top surface 248 and the bottom surface 250. For example, a height of the intermediate surface 252 is less than a height of the top surface 248 but greater than a height of the bottom surface 250. As illustrated before, a height of each surface of the high aspect ratio structure 240 is measured from the bottom surface 212.

When the chemistry A is used to etch the nitrogen-containing layer 2, another chemistry B is not used to etch the nitrogen-containing layer 2. For example, during a time period in which the chemistry A is applied to etch the nitrogen-containing layer 2, the chemistry B is not applied to etch the nitrogen-containing layer 2. It should be noted that if the chemistry B is used instead of the chemistry A, an etch stop occurs in which the nitrogen-containing layer 2 is not etched or the nitrogen-containing layer 2 is under etched. When the nitrogen-containing layer 2 is under etched, an etch rate of the nitrogen-containing layer 2 is below the pre-determined etch rate.

Figure 2D:
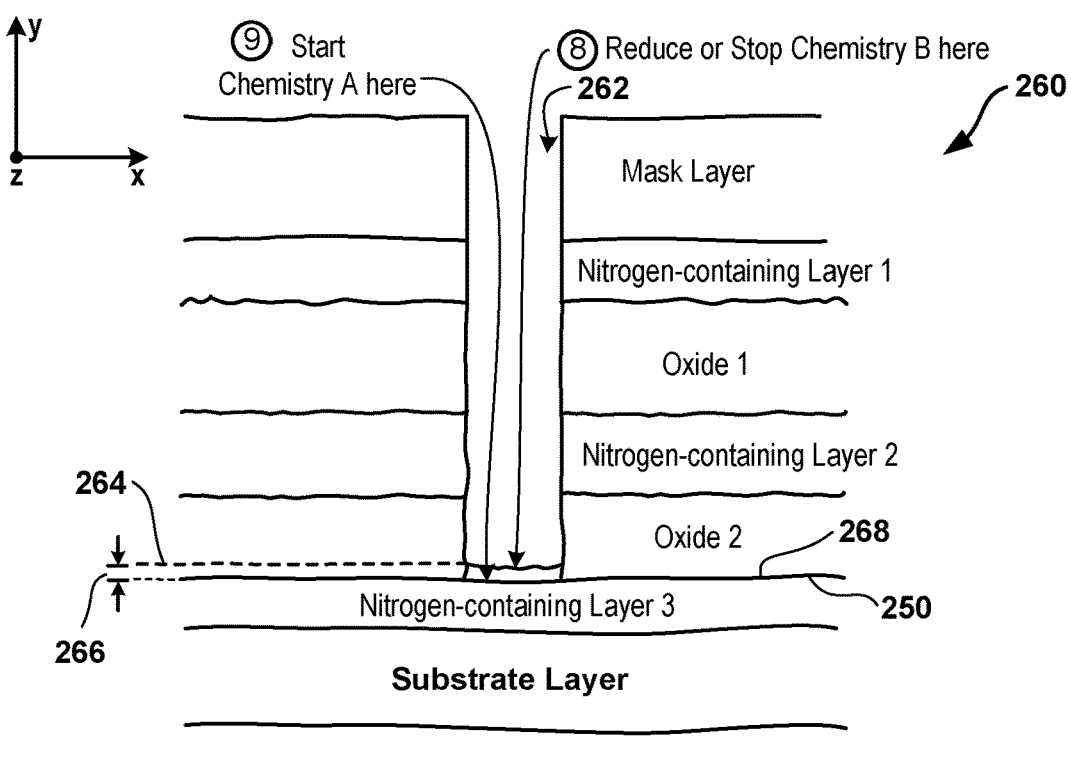
FIG. 2D is a diagram of an embodiment of a high aspect ratio structure to illustrate further processing of the high aspect ratio structure of FIG. 2C.

FIG. 2D is a diagram of an embodiment of a high aspect ratio structure 260 to illustrate further processing of the high aspect ratio structure 240 (FIG. 2C). The high aspect ratio structure 260 includes the same layers as the high aspect ratio structure 100 (FIG. 1) except that in the high aspect ratio structure 260, in addition to the mask layer, the nitrogen-containing layer 1, the oxide layer 1, and the nitrogen-containing layer 2, the oxide layer 2 is etched to form a feature 262 within the mask layer, the nitrogen-containing layer 1, the oxide layer 1, the nitrogen-containing layer 2, and the oxide layer 2. For example, the feature 242 (FIG. 2C) is etched further to form the feature 262. The remaining layers of the high aspect ratio structure 100 are not shown in FIG. 2D to not clutter FIG. 2D.

After application of the chemistry A to etch the nitrogen-containing layer 2 is stopped, the chemistry B is applied to etch the oxide layer 2. For example, the application of the chemistry B starts at the horizontal level 244 (FIG. 2C). The chemistry B is applied until a horizontal level 264 is reached. The horizontal level 264 is proximate to the nitrogen-containing layer 3. For example, the horizontal level 264 is at a preset distance 266 from a top surface 268 of the nitrogen-containing layer 3. As another example, the horizontal level 264 is closer to the nitrogen-containing layer 3 than to the nitrogen-containing layer 2. To illustrate, the horizontal level 264 is within a bottom half of the oxide layer 2 and not within a top half of the oxide layer 2. The top surface 268 of the nitrogen-containing layer 3 is adjacent to or adjoining the bottom surface 250 of the oxide layer 2. For example, there is no space between the top surface 268 and the bottom surface 250. It should be noted that during a time period in which the chemistry B is applied to etch the oxide layer 2, the chemistry A is not being applied.

At a time at which the horizontal level 264 is reached, application of the chemistry B is reduced or stopped. If the chemistry B is reduced at a time the horizontal level 264 is reached, application of the chemistry B stops when a horizontal level of the top surface 268 of the nitrogen-containing layer 2 is reached. It should be noted that during a time period in which the chemistry B is applied to etch the oxide layer 2, the chemistry A is not applied.

After the chemistry B is stopped or reduced, any remnant chemistry B from the application of the chemistry B etches the remaining portion of the oxide layer 2 for a pre-set time period. For example, after the chemistry B is stopped or reduced at the horizontal level 264, an oxide of the oxide layer 2 is etched by the remnant chemistry B until nitrogen-containing layer 3 is reached.

After passage of the pre-set time period since the application of the chemistry B is stopped or reduced, the chemistry A is applied to start etching the nitrogen-containing layer 3. As an example, the pre-set time period for etching the oxide layer 2 is equal to the pre-determined time period for etching the oxide layer 1. As another example, the pre-set time period for etching the oxide layer 2 is unequal to, such as greater than or less than, the pre-determined time period for etching the oxide layer 1.

Figure 2E:
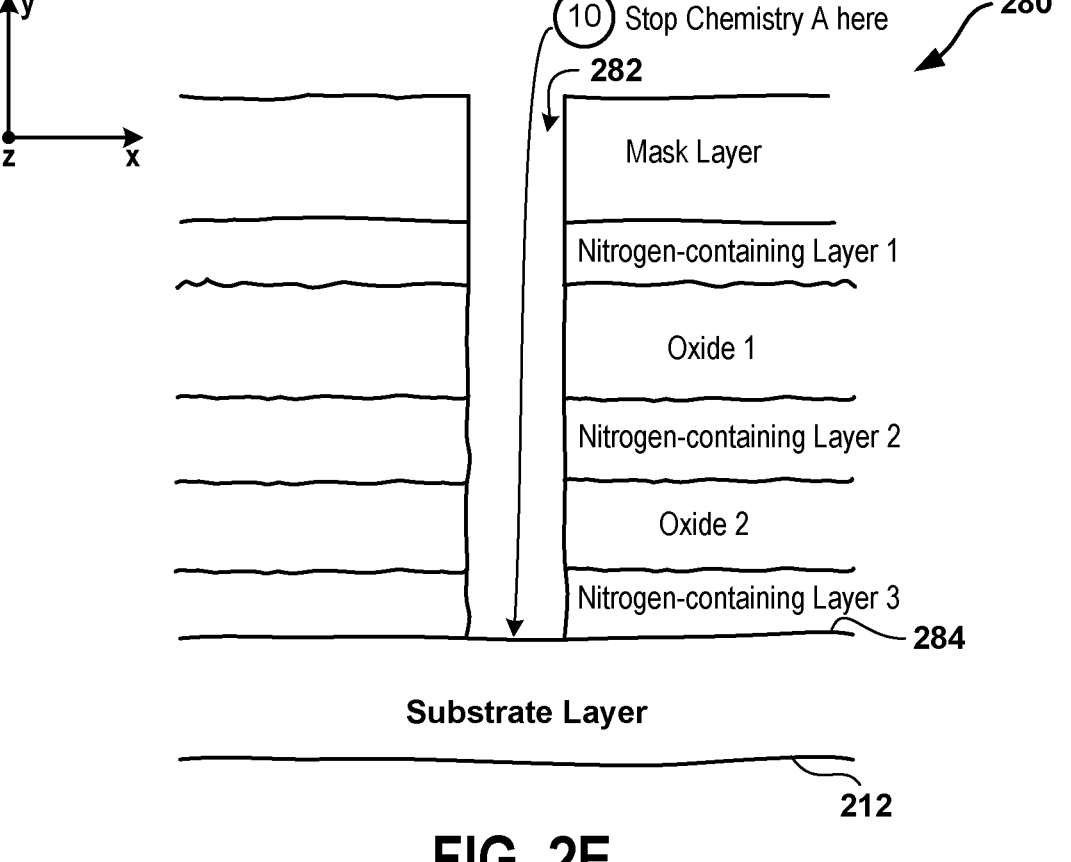
FIG. 2E is a diagram of a high aspect ratio structure to illustrate yet further processing of the high aspect ratio structure of FIG. 2D.

FIG. 2E is a diagram of a high aspect ratio structure 280 to illustrate further processing of the high aspect ratio structure 260 (FIG. 2D). The high aspect ratio structure 280 includes the same layers as the high aspect ratio structure 100 (FIG. 1) except that in the high aspect ratio structure 280, in addition to the mask layer, the nitrogen-containing layer 1, and the oxide layer 1, the nitrogen-containing layer 2, and the oxide layer 2, the nitrogen-containing layer 3 is etched to form a feature 282 within the mask layer, the nitrogen-containing layer 1, the oxide layer 1, the nitrogen-containing layer 2, the oxide layer 2, and the nitrogen-containing layer 3. For example, the feature 262 (FIG. 2D) is etched further to form the feature 282. The remaining layers of the high aspect ratio structure 100 are not shown in FIG. 2E to not clutter FIG. 2E.

The chemistry A is applied to etch the nitrogen-containing layer 3 until the substrate layer is reached. For example, the chemistry A is applied until a top surface 284 of the substrate layer is reached. The substrate layer extends from the top surface 284 to the bottom surface 212.

When the chemistry A is used to etch the nitrogen-containing layer 3, the chemistry B is not used to etch the nitrogen-containing layer 3. For example, during a time period in which the chemistry A is applied to etch the nitrogen-containing layer 3, the chemistry B is not applied to etch the nitrogen-containing layer 3. It should be noted that if the chemistry B is used instead of the chemistry A, an etch stop occurs in which the nitrogen-containing layer 3 is not etched or the nitrogen-containing layer 3 is under etched. When the nitrogen-containing layer 3 is under etched, an etch rate of the nitrogen-containing layer 3 is below the pre-determined etch rate. In this manner, as described with reference to FIGS. 2A-2E, the chemistries A and B are applied alternatively or consecutively to etch the nitride and oxide layers of the high aspect ratio structure 100.

FIG. 3 is a diagram of an embodiment of a system 300 to illustrate an application of the chemistries A and B. The system 300 includes a host computer 302, a low frequency (LF) radio frequency (RF) generator, a high frequency (HF) RF generator, a match, and a plasma chamber 304. As an example, the LF RF generator has an operating frequency of 400 kilohertz (kHz) or 2 megahertz (MHz). As an example, the HF RF generator has an operating frequency of 13.56 MHz or 27 MHz or 60 MHz. It should be noted that the operating frequency of the HF RF generator is greater than the operating frequency of the LF RF generator. The LF RF generator is an example of a primary generator and the HF RF generator is an example of a secondary generator.

The match is a network of circuit components, such as inductors, capacitors, and resistors. For example, the match includes one or more shunt circuits and one or more series circuits. Each shunt circuit has one or more of the circuit components and so does each series circuit. A first branch circuit, which includes one or more shunt circuits or one or more series circuits or a combination thereof, is coupled between an input 310 of the match and an output 314 of the match. Also, a second branch circuit, which includes one or more shunt circuits or one or more series circuits or a combination thereof, is coupled between an input 312 of the match and the output 314.

Examples of the host computer 302 include a desktop computer, a laptop computer, a controller, a tablet, and a smartphone. The host computer 302 includes a processor 306 and a memory device 308. The processor 306 is coupled to the memory device 308. Examples of a processor, as used herein, include a microprocessor, an application specific integrated circuit (ASIC), a programmable logic device (PLD), an integrated microcontroller, and a central processing unit (CPU). Examples of a memory device, as used herein, include a read-only memory (ROM), a random access memory (RAM), a flash memory, a storage disk array, a hard disk, etc.

The plasma chamber 304 includes a substrate support 316, such as an electrostatic chuck (ESC). The ESC includes a lower electrode 318. The plasma chamber 106 further includes a showerhead 320 in which an upper electrode 322 is embedded. Each of the lower electrode 318 and the upper electrode 322 is fabricated from a metal, such as aluminum or an alloy of aluminum. A bottom surface of the showerhead 320 is located above and facing a top surface of the substrate support 316. A substrate S is placed on a top surface of the substrate 316. An example of the substrate S is the high aspect ratio structure 100 (FIG. 1).

The system 300 further includes a gas source 324 and another gas source 326. An example of a gas source includes a container for storing a chemistry, described herein. To illustrate, the gas source 324 stores the chemistry A and the gas source 326 stores the chemistry B. As another illustration, the gas source 326 stores the chemistry B, the fluoro-carbon and nitrogen trifluoride. The system 300 further includes a driver A and a driver B. An example of a driver includes one or more transistors. For example, the driver includes one or more field effect transistors (FETs) that are coupled to each other.

The LF RF generator has an output 328 that is coupled via an RF cable RFC1 to the input 310, which is coupled to the first branch circuit of the match 310. Also, the HF RF generator has an output 330 that is coupled via an RF cable RFC2 to the input 312, which is coupled to the second branch circuit of the match 310. The first and second branch circuits are coupled to each other and to the output 314. The output 314 is coupled via an RF transmission line RFT to the lower electrode 318. The upper electrode 322 is coupled to a reference potential, such as a ground potential.

Also, the processor 306 is coupled to the LF RF generator via a transfer cable TC1 and is coupled to the HF RF generator via a transfer cable TC2. Examples of a transfer cable include a cable that is used for serial transfer of data, a cable used for parallel transfer of data, and a universal serial bus (USB) cable.

The gas source 324 is coupled via a gas supply line 332 to the showerhead 320. Also, the gas source 326 is coupled via a gas supply line 334 to the showerhead 320. Examples of a gas supply line include a gas duct or and a gas tube. The processor 306 is coupled to the driver A and is also coupled to the driver B. The driver A is coupled to a valve 336, which is coupled to the gas supply line 332. For example, the valve 336 is located within the gas supply line 332. Similarly, the driver B is coupled to a valve 337, which is coupled to the gas supply line 334. Examples of a valve include a valve assembly. To illustrate, the valve assembly includes a stationary valve plate and a movable valve plate. The movable valve plate slides with respect to the stationary valve plate. The stationary valve plate has multiple openings. Another illustration of the valve assembly includes a solenoid valve.

The processor 306 generates and provides a recipe signal having a recipe via the transfer cable TC1 to the LF RF generator. An example of the recipe that is provided to the LF RF generator is a frequency level and a parameter level of an LF RF signal 338, such as a sinusoidal signal, to be generated by the LF RF generator. Upon receiving the recipe, the LF RF generator stores the recipe.

Similarly, the processor 306 generates and provides a recipe signal having a recipe via the transfer cable TC2 to the HF RF generator. An example of the recipe that is provided to the HF RF generator is a frequency level and a parameter level of an HF RF signal 340, such as a sinusoidal signal, to be generated by the HF RF generator. Upon receiving the recipe, the HF RF generator stores the recipe.

The processor 306 generates a trigger signal, such as a signal having a single digital pulse, and sends the trigger signal via the transfer cable TC1 to the LF RF generator. Also, the processor 306 sends the trigger signal via the transfer cable TC2 to the HF RF generator.

In response to receiving the trigger signal, the LF RF generator generates the RF signal 338 and sends the RF signal 338 via the output 328 and the RF cable RFC1 to the input 310. Also, in response to receiving the trigger signal, the HF RF generator generates the RF signal 340 and sends the RF signal 340 via the output 330 and the RF cable RFC2 to the input 312.

The first branch circuit of the match 314 receives the RF signal 338 via the input 310 and the second branch circuit of the match 314 receives the RF signal 340 via the input 312. The match 314 modifies impedances of the RF signals 338 and 340 to output first and second modified RF signals. The impedances of the RF signal 338 and 340 are modified by matching an impedance of a load coupled to the output 314 with an impedance of a source coupled to the inputs 310 and 312. An example of the load includes the RF transmission line RFT and the plasma chamber 304. The example of the source includes the RF cables RFC1 and RFC2 and the LF and HF RF generators. The match 314 further combines, such as sums or adds, the first and second modified RF signals to output a modified RF signal 342 at the output 314. The modified RF signal 342 is provided via the RF transmission line RFT to the lower electrode 318.

Moreover, when the modified RF signal 342 is provided to the plasma chamber 304, the chemistries A and B are supplied in an alternative manner to the plasma chamber 304. For example, the processor 306 generates and sends a close drive signal to the driver A. Upon receiving the close drive signal, the driver A generates a current signal and provides the current signal to the valve 336 to close the valve 336. To illustrate, when the current signal is supplied to the valve 336 to close the valve 336, a field, such as a magnetic field, is generated to rotate the movable valve plate of the valve 336 with reference to the stationary valve plate of the valve 336 to close all of the openings of the stationary valve plate. When the valve 336 is closed, the chemistry A that is stored within the gas source 324 is not supplied via the gas supply line 332 to the showerhead 320. In this manner, when the valve 336 is closed, the application of chemistry A to the plasma chamber 304 stops.

As another example, the processor 306 generates and sends a completely open drive signal to the driver A. Upon receiving the completely open drive signal, the driver A generates a current signal and provides the current signal to the valve 336 to completely open the valve 336. To illustrate, when the current signal is supplied to the valve 336 to completely open the valve 336, a field, such as a magnetic field, is generated to rotate the movable valve plate of the valve 336 with reference to the stationary valve plate of the valve 336 to open all the openings of the stationary valve plate. When the valve 336 is completely open, the chemistry A that is stored within the gas source 324 is supplied via the gas supply line 332 to the showerhead 320.

As yet another example, the processor 306 generates and sends a partially open drive signal to the driver A. Upon receiving the partially open drive signal, the driver A generates a current signal and provides the current signal to the valve 336 to partially open the valve 336. To illustrate, when the current signal is supplied to the valve 336 to partially open the valve 336, a field, such as a magnetic field, is generated to rotate the movable valve plate of the valve 336 with reference to the stationary valve plate of the valve 336 to open at least one but not all openings or a portion of an opening of the stationary valve plate. When the valve 336 is partially open, the chemistry A that is stored within the gas source 324 is supplied, in a reduced manner, via the gas supply line 332 to the showerhead 320. To illustrate, an amount of chemistry A is supplied in the reduced manner when the amount is substantially less than an amount of chemistry A that is supplied when the valve 336 is completely open. To further illustrate, the amount of chemistry A is substantially less than the amount of chemistry A when the amount of chemistry A is between 0.1% and 10% of the amount of chemistry A when the valve 336 is completely open. In this manner, when the valve 336 is partially open, the application of chemistry A is reduced compared to when the valve 336 is completely open.

In a similar manner, as an example, the processor 306 generates and sends a close drive signal to the driver B. Upon receiving the close drive signal, the driver B generates a current signal and provides the current signal to the valve 337 to close the valve 337. To illustrate, when the current signal is supplied to the valve 337 to close the valve 337, a field, such as a magnetic field, is generated to rotate the movable valve plate of the valve 337 with reference to the stationary valve plate of the valve 337 to close all of the openings of the stationary valve plate. When the valve 337 is closed, the chemistry B that is stored within the gas source 326 is not supplied via the gas supply line 334 to the showerhead 320. In this manner, when the valve 337 is closed, the application of chemistry B stops.

As another example, the processor 306 generates and sends a completely open drive signal to the driver B. Upon receiving the completely open drive signal, the driver B generates a current signal and provides the current signal to the valve 337 to completely open the valve 337. To illustrate, when the current signal is supplied to the valve 337 to completely open the valve 337, the field is generated to rotate the movable valve plate of the valve 337 with reference to the stationary valve plate of the valve 337 to open all of the openings of the stationary valve plate. When the valve 337 is completely open, the chemistry B that is stored within the gas source 326 is supplied via the gas supply line 334 to the showerhead 320.

As yet another example, the processor 306 generates and sends a partially open drive signal to the driver B. Upon receiving the partially open drive signal, the driver B generates a current signal and provides the current signal to the valve 337 to partially open the valve 337. To illustrate, when the current signal is supplied to the valve 337 to partially open the valve 337, a field, such as a magnetic field, is generated to rotate the movable valve plate of the valve 337 with reference to the stationary valve plate of the valve 337 to open at least one but not all openings or a portion of an opening of the stationary valve plate. When the valve 337 is partially open, the chemistry B that is stored within the gas source 326 is supplied, in a reduced manner, via the gas supply line 334 to the showerhead 320. To illustrate, an amount of chemistry B is supplied in the reduced manner when the amount is substantially less than an amount of chemistry B that is supplied when the valve 337 is completely open. To further illustrate, the amount of chemistry B is substantially less than the amount of chemistry B when the amount of chemistry B is between 0.1% and 10% of the amount of chemistry B when the valve 337 is completely open. In this manner, when the valve 337 is partially open, the application of chemistry B is reduced compared to when the valve 337 is completely open.

The chemistry A or B is supplied in an alternative manner via the showerhead 320 to a gap 344 between the showerhead 320 and the substrate support 316. When the modified signal 342 and the chemistry A or B are supplied to the plasma chamber 304, plasma is generated or maintained within the gap 344 to process, such as etch, the substrate S.

In one embodiment, a table for controlling application of the chemistries A and B for predetermined time periods is provided. The table is stored in the memory device 308 and is generated before processing the substrate S. The table includes a listing of layers of the high aspect ratio structure 100 (FIG. 1) and of predetermined time periods for etching the layers. For example, the table includes that the nitrogen-containing layer 1 is to be etched for a first time period, the oxide layer 1 is to be etched for a second time period, the nitrogen-containing layer 2 is to be etched for a third time period, the oxide layer 2 is to be etched for a fourth time period, and the nitrogen-containing layer 3 is to be etched for a fifth time period.

The processor 306 accesses the table from the memory device 308 and determines to apply the chemistries A and B according to the time periods of the table. For example, the processor 306 determines to apply the chemistry A for the first time period to etch the nitrogen-containing layer 1 and determines to apply the chemistry B for the second time period to etch the oxide layer 1. Also, the processor 306 determines to apply the chemistry A for the third time period to etch the nitrogen-containing layer 2 and apply the chemistry B for the fourth time period to etch the oxide layer 2. The processor 306 determines to apply the chemistry A for the fifth time period to etch the nitrogen-containing layer 3.

The processor 306 controls each of the drivers A and B (FIG. 3) for a corresponding one of the first through fifth time periods to etch the nitrogen-containing and oxide layers of the high aspect ratio structure 100. For example, the processor 306 controls the driver A to completely open the valve 336 (FIG. 3). The valve 336 is controlled to be completely open for the first time period. After the first time period, the processor 306 controls the driver A to close the valve 336. Further, in the example, after the valve 336 is closed at an end of the first time period, the processor 306 controls the driver B to completely open the valve 337 (FIG. 3). The valve 337 is controlled to be completely open for the second time period. After the second time period, the processor 306 controls the driver B to close the valve 337. In the example, after the valve 337 is closed at an end of the second time period, the processor 306 closes the valve 336 to completely open for the third time period in the same manner in which the valve 336 is controlled to be completely open for the first time period. In the example, the processor 306 controls the valve 336 to close after the third time period. Also, in the example, after the valve 336 is closed at end of the third time period, the processor 306 controls the valve 337 to completely open for the fourth time period. In the example, the processor 306 controls the valve 337 to close after the fourth time period. Further, in the example, at an end of the fourth time period, the processor 306 controls the valve 336 to completely open for the fifth time period. After the fifth time period, the processor 306 controls the valve 336 to close.

It should be noted that during the first time period, the nitrogen-containing layer 1 and a portion of the oxide layer 1 are etched with the chemistry A until the horizontal level 212 (FIG. 2A) is reached. Similarly, during the second time period, the oxide layer 1 is etched with the chemistry B until the horizontal level 224 (FIG. 2B) is reached. Also, during the third time period, the nitrogen-containing layer 2 and a portion of the oxide layer 2 are etched with the chemistry A until the horizontal level 244 (FIG. 2C) is reached. Further, during the fourth time period, the oxide layer 2 is etched with the chemistry B until the horizontal level 264 (FIG. 2D) is reached. Also, during the fifth time period, the nitrogen-containing layer 3 is etched with the chemistry A until the substrate layer is reached.

In one embodiment, the predetermined time periods of the table are pre-calculated according to thicknesses of the oxide and nitrogen-containing layers of the high aspect ratio structure 100. The time periods of the table are pre-calculated during an experimental routine before etching the high aspect ratio structure 100. For example, when the nitrogen-containing layer 2 is thicker than the nitrogen-containing layer 1, the third time period is greater than the first time period. As another example, when the oxide layer 1 is thicker than the oxide layer 2, the second time period is greater than the fourth time period. As another example, a dummy substrate that imitates the high aspect ratio structure 100 is used to calculate the predetermined time periods of the table.

In an embodiment, the processor 306 determines that the horizontal level 224 is proximate to the nitrogen-containing layer 2. For example, the horizontal level 224 is closer to the nitrogen-containing layer 2 compared to the nitrogen-containing layer 1. To illustrate, the horizontal level 224 is within a bottom half of the oxide layer 1 and not within a top half of the oxide layer 1.

FIG. 4A is a diagram of an embodiment of a system 400 to illustrate use of an optical sensor 402 to determine times at which to switch between application of the chemistry A and application of the chemistry B. The system 400 has the same components as that of the system 300 (FIG. 3) except that the system 400 includes the optical sensor 402. An example of the optical sensor 402 includes an optical emission spectrometer (OES), or an endpoint detection sensor, or an infrared sensor.

The optical sensor 402 is located with respect to the plasma chamber 304 to have a field-of-view of plasma formed within the gap 344. For example, the optical sensor 402 is coupled to a window 404 that is integrated within a side wall 406 of the plasma chamber 304. The side wall 406 is fitted to a top wall 408 of the plasma chamber 304 and to a bottom wall 410 of the plasma chamber 304. The side wall 406 is located between the walls 408 and 410.

The optical sensor 402 is coupled to the processor 306. The processor 306 controls the valve 336 to apply the chemistry A to the gap 344 to etch the nitrogen-containing layer 1. While the nitrogen-containing layer 1 of substrate S is etched using the modified RF signal 342 and the chemistry A, the optical sensor 402 senses a first wavelength of the plasma formed in the gap 344 to output a first electrical signal during the first time period. The first electrical signal is sent during the first time period from the optical sensor 402 to the processor 306. The processor 306 determines whether an intensity of the first wavelength represented by the first electrical signal is within a predetermined range, such as a light intensity range 1, described below. If so, the processor 306 determines that the nitrogen-containing layer 1 is still being etched. After the nitrogen-containing layer 1 is etched and the oxide layer 1 has started etching, the optical sensor 402 senses a second wavelength of plasma within the gap 344 to generate a second electrical signal. The second electrical signal is sent from the optical sensor 402 to the processor 306. The processor 306 determines whether an intensity of the second wavelength represented by the second electrical signal is outside the predetermined range. For example, the processor 306 determines whether the intensity of the second wavelength is within a light intensity range 2, which is described below. If so, the processor 306 controls the valve 336 to close.

After controlling the valve 336 to close, the processor 306 controls the valve 337 to open. When the valve 337 is open, the optical sensor 402 senses the second wavelength of plasma formed in the gap 344 to output the second electrical signal for the second time period. The second time period is consecutive to the first time period. The processor 306 determines whether the second time period is equal to a predetermined time period. Upon determining that the second time period is equal to the predetermined time period, the processor 306 controls the valve 337 to close. After controlling the valve 337 to close, the processor 306 controls the valve 336 to open.

When the valve 336 is open, the optical sensor 402 senses the first wavelength of the plasma formed within the gap 344 to output the first electrical signal during the third time period, which is consecutive to the second time period. The first electrical signal is sent during the second time period from the optical sensor 402 to the processor 306. The processor 306 determines whether an intensity of the first wavelength represented by the second electrical signal is within the predetermined range. If so, the processor 306 determines that the nitrogen-containing layer 2 is still being etched. After the nitrogen-containing layer 2 is etched and the oxide layer 2 has started etching, the optical sensor 402 senses the second wavelength of plasma within the gap 344 to generate the second electrical signal. The processor 306 determines whether an intensity of the second wavelength represented by the second electrical signal is outside the predetermined range, and controls the valve 336 to close upon determining so.

After controlling the valve 336 to close again, which is after the third time period, the processor 306 controls the valve 337 to open. When the valve 337 opens, the optical sensor 402 senses the second wavelength of plasma formed in the gap 344 to output the second electrical signal for the fourth time period. The fourth time period is consecutive to the third time period. The processor 306 determines whether the fourth time period is equal to a preset time period. Upon determining that the fourth time period is equal to the preset time period, the processor 306 controls the valve 337 to close. After controlling the valve 337 to close at an end of the fourth time period, the processor 306 controls the valve 336 to open.

When the valve 336 is open after the fourth time period, the chemistry A is applied to the gap 344 to etch the nitrogen-containing layer 3. While the nitrogen-containing layer 3 of substrate S is etched using the modified RF signal 343 and the chemistry A, the optical sensor 402 senses the first wavelength of the plasma formed in the gap 344 to output the first electrical signal for the fifth time period. The fifth time period is consecutive to the fourth time period. The first electrical signal is sent during the fifth time period from the optical sensor 402 to the processor 306. The processor 306 determines whether an intensity of the first wavelength represented by the first electrical signal is within the predetermined range. If so, the processor 306 determines that the nitrogen-containing layer 3 is still being etched. Upon determining that the intensity of the first wavelength represented by the first electrical signal is within the predetermined range, the processor 306 determines whether the fifth time period is equal to a pre-stored time period. In response to determining that the fifth time period is equal to the pre-stored time period, the processor 306 controls the valve 336 to close to stop etching the high aspect ratio structure 280 (FIG. 2E).

In one embodiment, the processor 306 determines an intensity of a wavelength represented by an electrical signal output from the optical sensor 402 to be inversely proportional to the wavelength. For example, when the wavelength is high, the intensity is low and when the wavelength is low, the intensity is high. As another example, as the wavelength of light increases, the intensity of light decreases and as the wavelength decreases, the intensity increases.

In an embodiment, the processor 306 determines an intensity of light represented by an electrical signal based on an amplitude of the electrical signal. For example, when the amplitude is high, the intensity is determined to be high and when the amplitude is low, the intensity is determined to be low. As another example, as the amplitude increase, the intensity is determined to increase and as the amplitude decreases, the intensity is determined to decrease.

In one embodiment, the processor 306 is coupled to a clock source to receive a clock signal from the clock source. The processor 306 determines a time period, described herein, by counting a number of clock cycles of the clock signal.

In one embodiment, instead of determining whether the fifth time period is equal to the pre-stored time period, the processor 306 determines whether an intensity of a third wavelength represented by a third electrical signal output from the optical sensor 402 is outside the predetermined range. Upon determining that an intensity of the third wavelength represented by the third electrical signal output from the optical sensor 402 is outside the predetermined range, the processor 306 controls the valve 336 to close. For example, in response to determining that the intensity of the third wavelength is within a light intensity range 3, the processor 306 controls the valve 336 to close. To illustrate, the light intensity range 3 is different from the light intensity ranges 1 and 2. To further illustrate, the light intensity range 3 is exclusive to of the light intensity ranges 1 and 2.

In an embodiment, the terms pre-determined, preset, and pre-stored are used herein interchangeably.

Figure 4B:
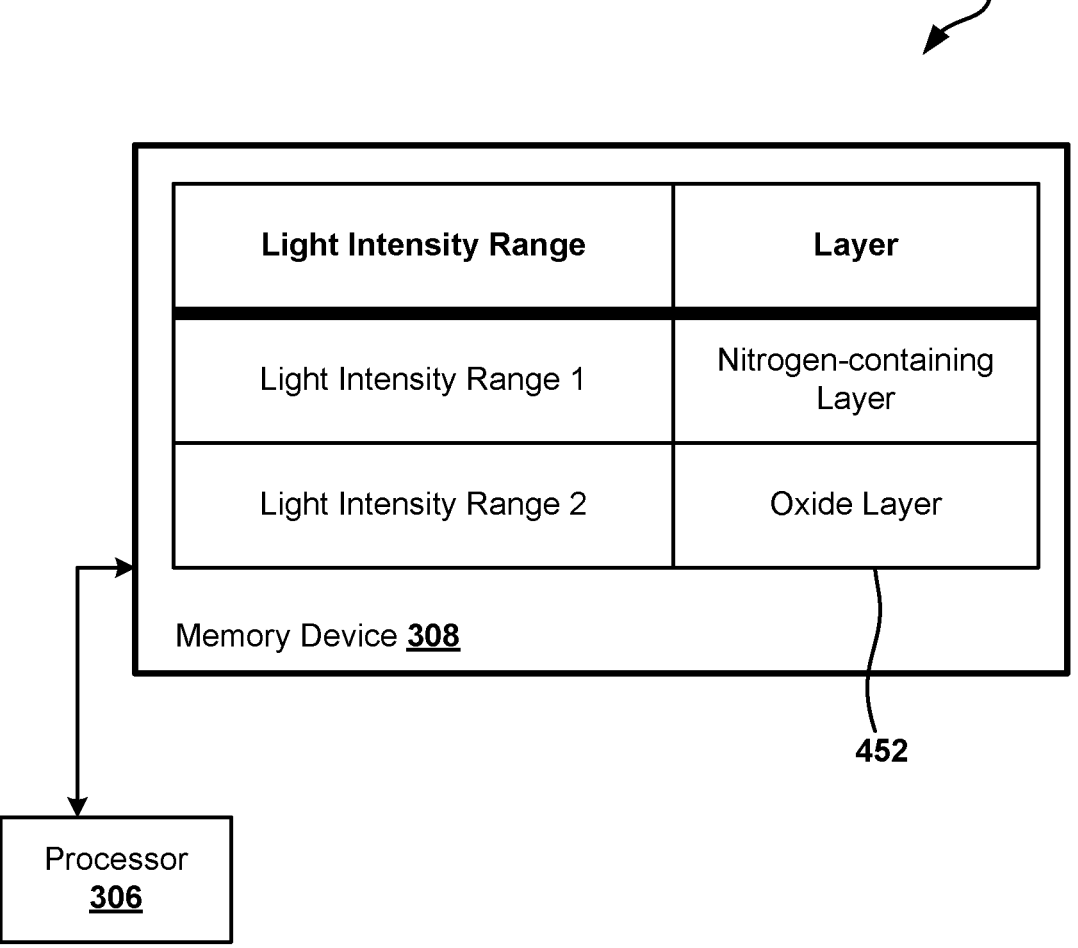
FIG. 4B is a diagram of an embodiment of a system to illustrate use of light intensity ranges to etch different layers of the high aspect ratio structure of FIG. 1.

FIG. 4B is a diagram of an embodiment of a system 450 to illustrate use of light intensity ranges to etch different layers of the high aspect ratio structure 100 (FIG. 1). The system 450 includes the processor 306 and the memory device 308. The memory device 308 stores a listing 452 of light intensity ranges and corresponding layers. For example, the listing 452 includes a correspondence, such as a mapping, between the light intensity range 1 and the nitrogen-containing layer 1, 2 or 3 of the high aspect ratio structure 100. The listing 452 further includes a correspondence between the light intensity range 2 and the oxide layer 1 or 2 of the high aspect ratio structure 100.

It should be noted that one or more values of the light intensity range 1 is different from, such as unequal to, one or more values of the light intensity range 2. As an example, values of the light intensity range 1 exclude values of the light intensity range 2.

The processor 306 determines whether an intensity of light represented by an electrical signal received from the optical sensor 402 (FIG. 4A) is within the light intensity range 1. Upon determining so, the processor 306 determines that the nitrogen-containing layer 1, 2, or 3 is being etched.

The processor 306 further determines whether an intensity of light represented by an electrical signal obtained from the optical sensor 402 is within the light intensity range 2. In response to determining so, the processor 306 determines that the oxide layer 1 or 2 is being etched.

In one embodiment, the listing 452 includes a correspondence between the light intensity range 3 and the substrate layer. The processor 306 determines whether an intensity of light represented by an electrical signal received from the optical sensor 402 is within the light intensity range 3. Upon determining so, the processor 306 determines that the substrate layer is being etched.

Figures 5A, 5B:
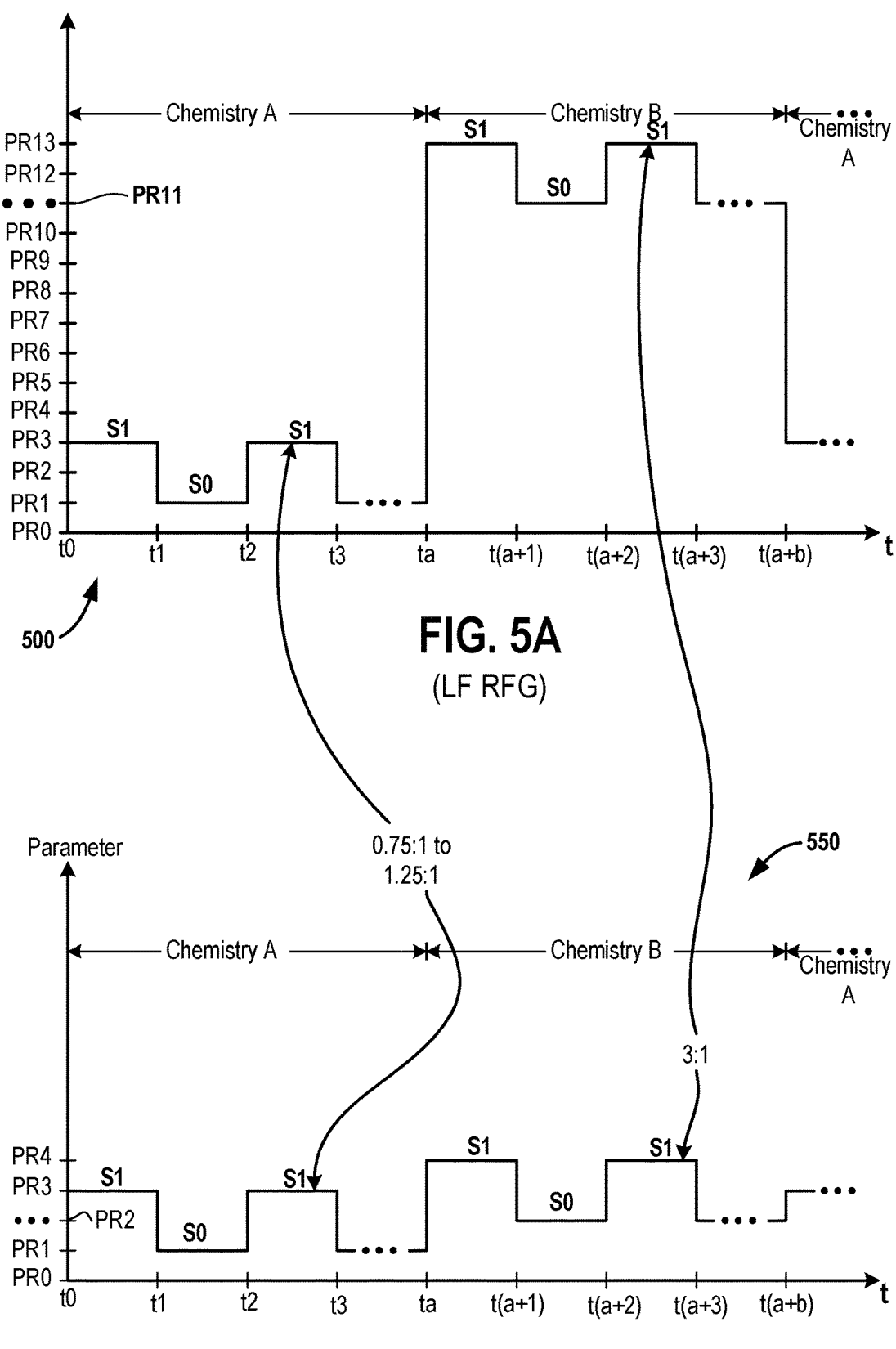
FIG. 5A is an embodiment of a graph to illustrate pulsing of a primary RF signal versus time t.
FIG. 5B is an embodiment of a graph to illustrate pulsing of a secondary RF signal versus the time t.

FIG. 5A is an embodiment of a graph 500 to illustrate pulsing of the RF signal 338 (FIG. 3) versus time t. The graph 500 plots a parameter level of the RF signal 338 versus the time t. Examples of a parameter include voltage and power. An example of a parameter level is a peak-to-peak amplitude. Another example of a parameter level is a zero-to-peak amplitude. The parameter level of the RF signal 338 is plotted on a y-axis and the time t is plotted on an x-axis.

The y-axis plots parameter levels PR0, PR1, PR3, PR5, PR7, PR9, PR11, and PR13 and the x-axis plots times t0, t1, t2, t3, and so on until times ta and t(a+1), where a is an integer greater than 3. The x-axis further plots a time t(a+2), a time t(a+3) and so on until a time t(a+b), where b is an integer greater than 3.

The parameter level PR3 is greater than the parameter level PR1, which is greater than the parameter level PR0. Similarly, the parameter level PR5 is greater than the parameter level PR3 and the parameter level PR7 is greater than the parameter level PR5. Also, the parameter level PR9 is greater than the parameter level PR7 and the parameter level PR11 is greater than the parameter level PR9. The parameter level PR13 is greater than the parameter level PR11.

The y-axis also has parameter levels PR2, PR4, PR6, PR8, PR10, and PR12. The parameter level PR2 is between, such as half way, the parameter levels PR1 and PR3. Similarly, the parameter level PR4 is between the parameter levels PR3 and PR5, and the parameter level PR6 is between the parameter levels PR5 and PR7. Also, the parameter level PR8 is between the parameter levels PR7 and PR9, the parameter level PR10 is between the parameter levels PR9 and PR11, and the parameter level PR12 is between the parameter levels PR11 and PR13.

During a time period in which the chemistry A is applied to the substrate S via the showerhead 322 (FIG. 3), the RF signal 338 has the parameter levels PR3 and PR1 and periodically transitions between the parameter levels PR3 and PR1. For example, the RF signal 338 is at the parameter level PR3 during a time interval between the time t0 and the time t1. The RF signal 338 transitions from the parameter level PR3 to the parameter level PR1 at the time t1, and remains at the parameter level PR1 for a time interval between the times t1 and t2. The RF signal 338 transitions from the parameter level PR1 to the parameter level PR3 at the time t2 and remains at the parameter level PR3 during a time interval between the times t2 and t3. The RF signal 338 transitions from the parameter level PR3 to the parameter level PR1 at the time t3. As such, the RF signal 338 transitions between the parameter levels PR1 and PR3 during application of the chemistry A. The chemistry A is applied from the time t0 to the time ta.

As another example, at the time t0, the processor 306 (FIG. 3) determines to control the valve 336 to apply the chemistry A to the substrate S. Also, at the time t0, the processor 306 sends a first instruction signal to the LF RF generator (FIG. 3) to transition the RF signal 338 from the parameter level PR11 or PR13 to the parameter level PR3 and then periodically transition the RF signal 338 between the parameter levels PR3 and PR1. In response to receiving the first instruction signal at the time t0, the LF RF generator modifies the parameter level PR11 or PR13 of the RF signal 338 to the parameter level PR3, and transitions the RF signal 338 between the parameter levels PR3 and PR1 during the time interval between the times t0 and ta.

Further, during a time period in which the chemistry B is applied to the substrate S, the RF signal 338 has the parameter levels PR13 and PR11 and transitions periodically between the parameter levels PR13 and PR11. As an example, the RF signal 338 is at the parameter level PR13 during a time interval between the time ta and the time na+1). The RF signal 338 transitions from the parameter level PR13 to the parameter level PR11 at the time t(a+1), and remains at the parameter level PR11 for a time interval between the times t(a+1) and t(a+2). The RF signal 338 transitions from the parameter level PR11 to the parameter level PR13 at the time t(a+2) and remains at the parameter level PR13 during a time interval between the times t(a+2) and t(a+3). The RF signal 338 transitions from the parameter level PR13 to the parameter level PR11 at the time t(a+3). As such, the RF signal 338 transitions between the parameter levels PR11 and PR13 during application of the chemistry B. The chemistry B is applied from the time ta to the time t(a+b).

As another example, at the time ta, the processor 306 (FIG. 3) determines to control the valve 337 to apply chemistry B to the substrate S. Also, at the time ta, the processor 306 sends a second instruction signal to the LF RF generator (FIG. 3) to transition the RF signal 338 from the parameter level PR1 to the parameter level PR13 and then periodically transition the RF signal 338 between the parameter levels PR13 and PR11. In response to receiving the second instruction signal at the time ta, the LF RF generator modifies the parameter level PR1 or PR 3 of the RF signal 338 to the parameter level PR13, and transitions the RF signal 338 between the parameter levels PR13 and PR11 during the time interval between the times ta and t(a+b). In this manner, as illustrated with reference to FIG. 5A, the RF signal 338 is controlled by the processor 306 via the LF RF generator to alternate between a set of the parameter level PR3 and PR1 or a set of the parameter levels PR13 and PR11 based on whether the chemistry A or B is applied.

It should be noted that the parameter level PR3 corresponds to a state S1 of the RF signal 338 and the parameter level PR1 corresponding to a state S0 of the RF signal 338 during application of the chemistry A. Similarly, the parameter level PR13 defines a state S1 of the RF signal 338 during application of the chemistry B and the parameter level PR11 defines a state S0 of the RF signal 338 during application of the chemistry B.

In one embodiment, instead of transitioning between the parameter levels PR1 and PR3, the RF signal 338 transitions between the parameter levels PR0 and PR2.

FIG. 5B is an embodiment of a graph 550 to illustrate pulsing of the RF signal 340 (FIG. 3) versus the time t. The graph 550 plots a parameter level of the RF signal 340 versus the time t. The parameter level of the RF signal 340 is plotted on a y-axis and the time t is plotted on an x-axis. The y-axis of the graph 550 plots the parameter levels PR0 through PR4. The x-axis of the graph 550 plots the times t0, t1, t2, t3, and so on until the time t(a+b).

During the time period in which the chemistry A is applied to the substrate S, the RF signal 340 has the parameter levels PR3 and PR1 and periodically transitions between the parameter levels PR3 and PR1 in the same manner in which the RF signal 338 transitions between the parameter levels PR3 and PR1. As an example, at the time t0, the processor 306 (FIG. 3) determines to open the valve 336 to apply the chemistry A to the substrate S. Also, at the time t0, the processor 306 sends the first instruction signal to the HF RF generator (FIG. 3) to transition the RF signal 340 from the parameter level PR4 or PR2 to the parameter level PR3 and then periodically transition the RF signal 340 between the parameter levels PR3 and PRE In response to receiving the first instruction signal at the time t0, the HF RF generator modifies the parameter level PR4 or PR2 of the RF signal 340 to the parameter level PR3, and transitions the RF signal 340 between the parameter levels PR3 and PR1 during the time interval between the times t0 and ta.

As another example, a ratio of a parameter level of the RF signal 338 and a parameter level of the RF signal 340 during the time period between the times t0 and ta ranges from and including 0.75 to 1.25. To illustrate, the parameter level of the RF signal 338 is 75% or 80% of the parameter level of the RF signal 340 during the time period between the times t0 and ta. As another illustration, the parameter level of the RF signal 338 is equal to the parameter level of the RF signal 340 during the time period between the times t0 and ta. As yet another illustration, the parameter level of the RF signal 338 is 120% of the parameter level of the RF signal 340 during the time period between the times t0 and ta.

As yet another example, a ratio of a parameter level of the RF signal 338 and a parameter level of the RF signal 340 during the time period between the times ta and t(a+b) ranges from and including 2 to 4. To illustrate, the parameter level of the RF signal 338 is twice the parameter level of the RF signal 340 during the time period between the times ta and t(a+b). As another illustration, the parameter level of the RF signal 338 is equal to three times the parameter level of the RF signal 340 during the time period between the times ta and t(a+b).

Further, during the time period in which the chemistry B is applied to the substrate S, the RF signal 340 has the parameter levels PR4 and PR2 and transitions periodically between the parameter levels PR4 and PR2. As an example, the RF signal 340 is at the parameter level PR4 during a time interval between the time ta and the time t(a+1). The RF signal 340 transitions from the parameter level PR4 to the parameter level PR2 at the time t(a+1), and remains at the parameter level PR2 for the time interval between the times t(a+1) and t(a+2). The RF signal 340 transitions from the parameter level PR2 to the parameter level PR4 at the time t(a+2) and remains at the parameter level PR4 during a time interval between the times t(a+2) and t(a+3). The RF signal 340 transitions from the parameter level PR4 to the parameter level PR2 at the time t(a+3). As such, the RF signal 340 transitions between the parameter levels PR4 and PR2 during application of the chemistry B.

As another example, at the time ta, the processor 306 sends the instruction signal to the HF RF generator to transition the RF signal 340 from the parameter level PR1 to the parameter level PR4 and then periodically transition the RF signal 340 between the parameter levels PR4 and PR2. In response to receiving the second instruction signal at the time ta, the HF RF generator modifies the parameter level PR1 or PR3 of the RF signal 338 to the parameter level PR4, and transitions the RF signal 340 between the parameter levels PR4 and PR1 during the time interval between the times ta and t(a+b). In this manner, as illustrated with reference to FIG. 5B, the RF signal 340 is controlled by the processor 306 via the HF RF generator to alternate between the set of the parameter level PR3 and PR1 or a set of the parameter levels PR4 and PR2 based on whether the chemistry A or B is applied to the plasma chamber 304.

It should be noted that a parameter level of an RF signal includes one or more values of the parameter of the RF signal. For example, a first parameter level is exclusive of another parameter value. To illustrate, all values of the first parameter level are exclusive of, such as unequal to, values of the second parameter level.

It should further be noted that the parameter level PR3 corresponds to a state S1 of the RF signal 340 and the parameter level PR1 corresponding to a state S0 of the RF signal 340 during application of the chemistry A. Similarly, the parameter level PR4 defines a state S1 of the RF signal 340 during application of the chemistry B and the parameter level PR2 defines a state S0 of the RF signal 340 during application of the chemistry B.

Figure 6:
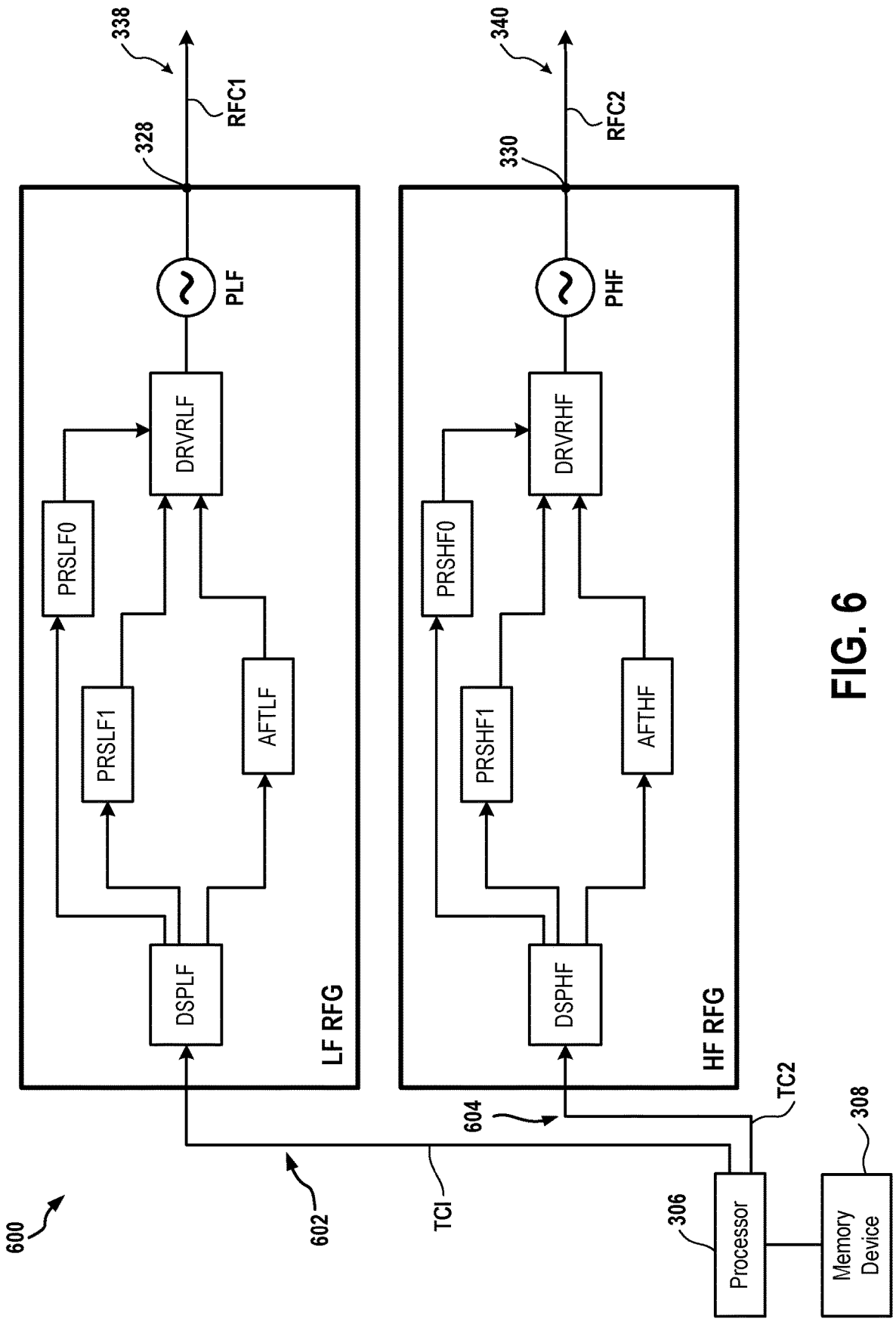
FIG. 6 is a diagram of an embodiment of a system to illustrate a low frequency (LF) radio frequency (RF) generator and a high frequency (HF) RF generator for level-to-level pulsing during application of the chemistries A and B.

FIG. 6 is a diagram of an embodiment of a system 600 to illustrate the LF RF generator and the HF RF generator for achieving level-to-level pulsing during application of the chemistries A and B. The system 600 includes the processor 306, the memory device 308, the LF RF generator, and the HF RF generator.

The LF RF generator includes a digital signal processor DSPLF, a parameter controller PRSLF1, another parameter controller PRSLF0, an auto-frequency tuner AFTLF. The LF RF generator further includes a driver DRVRLF and a power supply PLF. Examples of a controller, as used herein, includes an ASIC, a PLD, and a microprocessor coupled to a memory device. An example of a tuner, as used herein, includes a controller. To illustrate, the tuner includes a microprocessor, an ASIC, or a PLD. An example of a power supply, as used herein, includes an electronic oscillator or an RF oscillator that produces a periodic, oscillating electronic signal, such as a sinusoidal RF signal.

The digital signal processor DSPLF is coupled to the parameter controllers PRSLF1 and PRSLF0, and to the auto frequency tuner AFTLF. Moreover, each of the parameter controllers PRSLF1 and PRSLF0 and the auto-frequency tuner AFTLF is coupled to the driver DRVRLF, which is coupled to the power supply PLF. The power supply PLF is coupled to the RF cable RFC1.

Similarly, the HF RF generator includes a digital signal processor DSPHF, a parameter controller PRSHF1, another parameter controller PRSHF0, an auto-frequency tuner AFTHF. The HF RF generator further includes a driver DRVRHF and a power supply PHF.

The digital signal processor DSPHF is coupled to the parameter controllers PRSHF1 and PRSHF0, and to the auto frequency tuner AFTHF. Moreover, each of the parameter controllers PRSHF1 and PRSHF0 and the auto-frequency tuner AFTHF is coupled to the driver DRVRHF, which is coupled to the power supply PHF. The power supply PHF is coupled to the RF cable RFC2.

The processor 306 is coupled via the transfer cable TC1 to the digital signal processor DSPLF. Also, the processor 306 is coupled via the transfer cable TC2 to the digital signal processor DSPHF.

The processor 306 sends a recipe signal 602 via the transfer cable TC1 to the digital signal processor DSPLF. The recipe signal 602 includes a parameter level for a state S1 of the RF signal 338 to be achieved during application of the chemistry A, a parameter level for a state S0 of the RF signal 338 to be achieved during application of the chemistry A, a parameter level for the state S1 of the RF signal 338 to be achieved during application of the chemistry B, and a parameter level for the state S0 of the RF signal 338 to be achieved during application of the chemistry B. Also, the recipe signal 602 includes a frequency of the RF signal 338 to be achieved during application of the chemistries A and B. The recipe signal 602 further includes a duty cycle for the state S1 during application of the chemistry A and a duty cycle for the state S1 during application of the chemistry B.

Upon receiving the recipe signal 602, the digital signal processor DSPLF sends the parameter levels and duty cycles for the states S1 of the RF signal 338 to be achieved during application of the chemistries A and B to the parameter controller PRSLF1. Similarly, in response to receiving the recipe signal 602, the digital signal processor DSPLF sends the duty cycles for the states S1 of the RF signal 338 and the parameter levels for the states S0 of the RF signal 338 to be achieved during application of the chemistries A and B to the parameter controller PRSLF0. Moreover, the digital signal processor DSPLF sends the frequency of the RF signal 338 to be achieved during application of the chemistries A and B to the auto-frequency tuner AFTLF.

The parameter controller PRSLF1 stores the parameter levels and the duty cycles for the states S1 of the RF signal 338 to be achieved during application of the chemistries A and B in the memory device of the parameter controller PRSLF1. In a similar manner, the parameter controller PRSLF0 stores the duty cycles for the states S1 of the RF signal 338 and the parameter levels for the states S0 of the RF signal 338 to be achieved during application of the chemistries A and B in the memory device of the parameter controller PRSLF0. Also, the auto-frequency tuner AFTLF stores the frequency of the RF signal 338 to be achieved during application of the chemistries A and B in the memory device of the auto-frequency tuner AFTLF.

During or simultaneous with application of a chemistry L, such as the chemistry A or B, the processor 306 generates and sends a corresponding instruction signal, such as the first or second instruction signal, via the transfer cable TC1 to the digital signal processor DSPLF. For example, the first instruction signal corresponds to, such as, has a one-to-one relationship with or a mapping with, the chemistry A and the second instruction signal corresponds to the chemistry B.

Upon receiving the corresponding instruction signal from the processor 306, the digital signal processor DSPLF sends the corresponding instruction signal generated during application of the chemistry L to the parameter controllers PRSLF1 and PRSLF0 and to the auto-frequency tuner AFTLF. In response to receiving the corresponding instruction signal during application of the chemistry L, the parameter controller PRSLF1 generates a command signal based on the parameter level for the state S1 of the RF signal 338 and sends the command signal to the driver DRVRLF. The command signal is sent to the driver DRVRLF to generate a drive signal, such as a current signal, for a time period of the duty cycle for the state S1 during application of the chemistry L. In addition, upon receiving the corresponding instruction signal during application of the chemistry L, the auto-frequency tuner AFTLF generates a command signal based on the frequency of the RF signal 338 to be generated and sends the command signal to the driver DRVRLF. Upon receiving the command signals from the parameter controller PRSLF1 and the auto-frequency tuner AFTLF, the driver DRVRLF generates the drive signal during a time period of the duty cycle for the state S1 of the RF signal 338 during application of the chemistry L. The power supply PLF receives the driver signal during the time period for the state S1 from the driver DRVRLF, generates the state S1 of the RF signal 338 for the time period during application of the chemistry L, and sends the RF signal 338 having the state S1 via the output 338 and the RF cable RFC1 to the match.

Furthermore, upon receiving the corresponding instruction signal during application of the chemistry L, the parameter controller PRSLF0 waits for the time period of the duty cycle for the state S1 of the RF signal 338 before generating a command signal based on the parameter level for the state S0 of the RF signal 338. After the wait, the parameter controller PRSLF0 generates the command signal and sends the command signal to the driver DRVRLF. The command signal is sent to the driver DRVRLF to generate a drive signal for a time period of a duty cycle for the state S0 during application of the chemistry L. As an example, the duty cycle for the state S0 of the RF signal 338 is a difference between 100% and the duty cycle for the state S1 of the RF signal 338. Upon receiving the command signals from the parameter controller PRSLF0 and the auto-frequency tuner AFTLF, the driver DRVRLF generates the drive signal for a time period of the duty cycle for the state S0 of the RF signal 338 during application of the chemistry L. The power supply PLF receives the driver signal for the state S0 from the driver DRVRLF, generates the state S0 of the RF signal 338 for the time period of the state S0 during application of the chemistry L, and sends the RF signal 338 having the state S0 via the output 328 and the RF cable RFC1 to the match.

It should be noted that the driver signal for the state S0 of the RF signal 338 during application of the chemistry L is generated and sent during a remaining portion of a clock cycle of a clock signal. For example, the duty cycle for the state S1 of the RF signal 338 during application of the chemistry L is 50% of the clock cycle and the remaining portion is the remaining 50% of the clock cycle. The clock signal is generated and supplied by the processor 306 via the transfer cable TC1 to the digital signal processor DSPLF, which sends the clock signal to the parameter controllers PRSLF1 and PRSLF2. After the driver signal for the state S0 during application of the chemistry L is generated and sent during the remaining portion of the clock cycle, the parameter controller PRSLF1 generates again the command signal based on the parameter level for the state S1 of the RF signal 338 and sends the command signal to the driver DRVRLF. In this manner, the states S1 and S0 of the RF signal 338 alternate periodically during application of the chemistry L.

Similarly, for the HF RF generator, the processor 306 sends a recipe signal 604 via the transfer cable TC2 to the digital signal processor DSPHF. The recipe signal 604 includes a parameter level for a state S1 of the RF signal 340 to be achieved during application of the chemistry A, a parameter level for a state S0 of the RF signal 340 to be achieved during application of the chemistry A, a parameter level for the state S1 of the RF signal 340 to be achieved during application of the chemistry B, and a parameter level for the state S0 of the RF signal 340 to be achieved during application of the chemistry B. Also, the recipe signal 604 includes a frequency of the RF signal 340 to be achieved during application of the chemistries A and B. The recipe signal 604 further includes a duty cycle for the state S1 of the RF signal 340 during application of the chemistry A and a duty cycle for the state S1 of the RF signal 340 during application of the chemistry B.

Upon receiving the recipe signal 604, the digital signal processor DSPHF sends the parameter levels and the duty cycles for the states S1 of the RF signal 340 to be achieved during application of the chemistries A and B to the parameter controller PRSHF1. Similarly, in response to receiving the recipe signal 604, the digital signal processor DSPHF sends the duty cycles for the states S1 of the RF signal 340 and the parameter levels for the states S0 of the RF signal 340 to be achieved during application of the chemistries A and B to the parameter controller PRSHF0. Moreover, the digital signal processor DSPHF sends the frequency of the RF signal 340 to be achieved during application of the chemistries A and B to the auto-frequency tuner AFTHF.

The parameter controller PRSHF1 stores the duty cycles and the parameter levels for the states S1 of the RF signal 340 to be achieved during application of the chemistries A and B in the memory device of the parameter controller PRSHF1. In a similar manner, the parameter controller PRSHF0 stores the duty cycles for the states S1 of the RF signal 340 and the parameter levels for the states S0 of the RF signal 340 to be achieved during application of the chemistries A and B in the memory device of the parameter controller PRSHF. Also, the auto-frequency tuner AFTHF stores the frequency of the RF signal 340 to be achieved during application of the chemistries A and B in the memory device of the auto-frequency tuner AFTHF.

During application of the chemistry L, the processor 306 generates and sends the corresponding instruction signal via the transfer cable TC2 to the digital signal processor DSPHF. Upon receiving the corresponding instruction signal, the digital signal processor DSPHF sends the corresponding instruction signal generated during application of the chemistry L to the parameter controllers PRSHF1 and PRSHF0 and to the auto-frequency tuner AFTHF. In response to receiving the corresponding instruction signal during application of the chemistry L, the parameter controller PRSHF1 generates a command signal based on the parameter level for the state S1 of the RF signal 340 and sends the command signal to the driver DRVRHF. The command signal is sent to the driver DRVRHF to generate a drive signal, such as a current signal, for a time period of the duty cycle for the state S1 during application of the chemistry L. In addition, upon receiving the corresponding instruction signal during application of the chemistry L, the auto-frequency tuner AFTHF generates a command signal based on the frequency of the RF signal 340 and sends the command signal to the driver DRVRHF. Upon receiving the command signals from the parameter controller PRSHF1 and the auto-frequency tuner AFTHF, the driver DRVRHF generates the drive signal for a time period of the state S1 of the RF signal 340 during application of the chemistry L. The power supply PHF receives the driver signal for the state S1 from the driver DRVRHF, generates the state S1 of the RF signal 340 for a time period of the state S1 of the RF signal 340 during application of the chemistry L, and sends the RF signal 340 having the state S1 via the output 330 and the RF cable RFC2 to the match.

Furthermore, upon receiving the corresponding instruction signal during application of the chemistry L, the parameter controller PRSHF0 waits for the time period of the duty cycle of state S1 of the RF signal 340 before generating a command signal based on the parameter level for the state S0 of the RF signal 340. After the wait, the parameter controller PRSHF0 generates the command signal and sends the command signal to the driver DRVRHF. The command signal is sent to the driver DRVRHF to generate a drive signal for a time period of the duty cycle for the state S0 during application of the chemistry L. Upon receiving the command signals from the parameter controller PRSHF0 and the auto-frequency tuner AFTHF, the driver DRVRHF generates the drive signal for a time period for the state S0 of the RF signal 340 during application of the chemistry L. The time period for the state S0 of the RF signal 340 is a difference between 100% and a time period of the duty cycle for the state S1 of the RF signal 340. The power supply PHF receives the driver signal for the state S0 from the driver DRVRHF, generates the state S0 of the RF signal 340 for the time period of the state S0 of the RF signal 340 during application of the chemistry L, and sends the RF signal 340 having the state S0 via the output 330 and the RF cable RFC2 to the match.

It should be noted that the driver signal for the state S0 of the RF signal 340 during application of the chemistry L is generated and sent during a remaining portion of the clock cycle of the clock signal. For example, the duty cycle for the state S1 of the RF signal 340 during application of the chemistry L is 50% of the clock cycle and the remaining portion is the remaining 50% of the clock cycle. The clock signal is supplied by the processor 306 via the transfer cable TC2 to the digital signal processor DSPHF, which sends the clock signal to the parameter controllers PRSHF1 and PRSHF2.

After the driver signal for the state S0 during application of the chemistry L is generated and sent during the remaining portion of the clock cycle, the parameter controller PRSHF1 generates again the command signal based on the parameter level for the state S1 of the RF signal 340 and sends the command signal to the driver DRVRHF. In this manner, the states S1 and S0 of the RF signal 340 alternate periodically during application of the chemistry L.

In one embodiment, the digital signal processor DSPLF and one or more of the controllers PRSLF1, PRSLF0, and AFTLF are integrated within any number of controllers. For example, functions, described herein as being performed by the digital signal processor DSPLF and one or more of the controllers PRSLF1, PRSLF0, and AFTLF are performed by the single controller. As another example, functions, described herein as being performed by the digital signal processor DSPLF and one or more of the controllers PRSLF1, PRSLF0, and AFTLF are performed by two or more controllers.

Similarly, in one embodiment, the digital signal processor DSPHF and one or more of the controllers PRSHF1, PRSHF0, and AFTHF are integrated within any number of controllers. For example, functions, described herein as being performed by the digital signal processor DSPHF and one or more of the controllers PRSHF1, PRSHF0, and AFTHF are performed by a single controller. As another example, functions, described herein as being performed by the digital signal processor DSPHF and one or more of the controllers PRSHF1, PRSHF0, and AFTHF are performed by two or more controllers.

In an embodiment, each chemistry A or B is removed from the plasma chamber 304 (FIG. 3) after application of the chemistry and before application of another chemistry B or A is applied. For example, the chemistry A is removed before application of the chemistry B and the chemistry B is removed before application of the chemistry A. To further illustrate, one or more vacuum pumps are coupled to the plasma chamber 304. The processor 306 is coupled to the one or more vacuum pumps via corresponding one or more drivers. After the chemistry L, such as the chemistry A or B, is applied to the gap 344 (FIG. 3) and after passage of a pre-arranged time period since application of the chemistry L, the processor 306 sends one or more turn on command signals to the one or more drivers. Upon receiving the one or more turn on command signals, the corresponding one or more drivers generate corresponding one or more current signals, and send the corresponding one or more current signals to the corresponding one or more vacuum pumps to turn on the one or more vacuum pumps. When the one or more vacuum pumps are turned on, the one or more vacuum pumps remove the chemistry L from the plasma chamber 304.

In the embodiment, the processor 306 determines whether a pre-established amount of time has passed since the one or more vacuum pumps are turned on. Upon determining that the pre-established amount of time has passed, the processor 306 determines to turn off the one or more vacuum pumps. To turn off the one or more vacuum pumps, the processor 306 sends one or more turn off command signals to the one or more drivers. Upon receiving the one or more turn off command signals, the corresponding one or more drivers generate corresponding one or more current signals, and sends the corresponding one or more current signals to the corresponding one or more vacuum pumps to turn off the one or more vacuum pumps. When the one or more vacuum pumps are turned off, the one or more vacuum pumps do not remove the chemistry L from the plasma chamber 304. Also, during a time period in which the one or more vacuum pumps are turned off, the chemistry L, such as B or A, is applied to the gap 344 within the plasma chamber 304. In this manner, the chemistries A and B are alternatively applied and removed from the plasma chamber 304.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system, described herein, includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network.

When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for etching a stack, comprising:
etching a first nitrogen-containing layer of the stack by applying a non-metal gas;
discontinuing the application of the non-metal gas upon determining that a first oxide layer is reached, wherein the first oxide layer is under the first nitrogen-containing layer;
etching the first oxide layer by applying a metal-containing gas;
discontinuing the application of the metal-containing gas before the etching of the first oxide layer is complete and before a second nitrogen-containing layer is reached, wherein the second nitrogen-containing layer is situated under the first oxide layer; and
etching the second nitrogen-containing layer by applying the non-metal gas.

2. The method of claim 1, wherein the first oxide layer is reached when the first oxide layer is being etched, wherein the first oxide layer is being etched when a pre-determined depth from a top surface of the oxide layer is reached.

3. The method of claim 1, wherein the non-metal gas includes a hydrofluorocarbon.

4. The method of claim 1, wherein the application of the metal-containing gas is discontinued while the first oxide layer is etched.

5. The method of claim 1, wherein said etching the first nitrogen-containing layer continues until a recess is formed in the first oxide layer, wherein the application of the non-metal gas is discontinued upon determining that the recess is formed in the first oxide layer.

6. The method of claim 5, wherein the recess is of a pre-determined depth.

7. The method of claim 1, further comprising:
discontinuing the application of the non-metal gas used to etch the second nitrogen-containing layer;
applying the metal-containing gas to etch a second oxide layer, wherein the second oxide layer is located under the second nitrogen-containing layer.

8. The method of claim 7, further comprising:
discontinuing the application of the metal-containing gas used to etch the second oxide layer upon determining that a pre-determined level proximate to a third nitrogen-containing layer is reached, when the third nitrogen-containing layer is located under the second oxide layer; and
etching the third nitrogen-containing layer by applying the non-metal gas after said discontinuing the application of the metal-containing gas used to etch the second oxide layer.

9. The method of claim 1, wherein the metal-containing gas includes carbonyl or a metal fluoride.

10. The method of claim 9, wherein the metal fluoride is tungsten hexafluoride.

11. The method of claim 9, wherein the metal-containing gas is applied with a fluorocarbon or nitrogen trifluoride (NF$_3$).

12. The method of claim 1, further comprising:
supplying a low frequency radio frequency (LF RF) signal having a first primary parameter level and a second primary parameter level for said etching the first nitrogen-containing layer;
modifying the first primary parameter level to a third primary parameter level and the second primary parameter level to a fourth primary parameter level when etching the first oxide layer.

13. The method of claim 12, wherein the second primary parameter level is lower than the first primary parameter level and the fourth primary parameter level is lower than the third primary parameter level, wherein the third primary parameter level is greater than the first primary parameter level and the fourth primary parameter level is greater than the second primary parameter level.

14. The method of claim 12, further comprising:
supplying a high frequency RF (HF RF) signal having a first secondary parameter level and a second secondary parameter level for said etching the first nitrogen-containing layer;
modifying the first secondary parameter level to a third secondary parameter level and the second secondary parameter level to a fourth secondary parameter level when etching the first oxide layer.

15. The method of claim 14, wherein the second secondary parameter level is lower than the first secondary parameter level and the fourth secondary parameter level is lower than the third secondary parameter level, wherein the third secondary parameter level is greater than the first secondary parameter level and the fourth secondary parameter level is greater than the second secondary parameter level.

16. The method of claim 15, wherein a ratio of the first primary parameter level to the first secondary parameter level is between 0.75 and 1.25, wherein a ratio of the second primary parameter level to the second secondary parameter level is between 0.75 and 1.25.

17. The method of claim 15, wherein a ratio of the third primary parameter level to the third secondary parameter level is between 2 and 4, wherein a ratio of the fourth primary parameter level to the fourth secondary parameter level is between 2 and 4.

18. A method for etching a stack, comprising:

etching an oxide layer by applying a metal-containing gas;

discontinuing the application of the metal-containing gas before the etching of the oxide layer is complete and before a silicon-containing layer is reached, wherein the silicon-containing layer is situated under the oxide layer; and etching the silicon-containing layer by applying a non-metal gas.

19. The method of claim 18, wherein the oxide layer is reached when the oxide layer is being etched, wherein the oxide layer is being etched when a pre-determined depth from a top surface of the oxide layer is reached.

20. The method of claim 18, wherein the silicon-containing layer is a silicon-nitride layer or a polysilicon layer.

21. The method of claim 18, wherein the metal-containing gas is applied with a fluorocarbon or nitrogen trifluoride ($NF_3$).

22. The method of claim 18, wherein the non-metal gas includes a hydrofluorocarbon.

23. The method of claim 18, wherein the application of the metal-containing gas is discontinued while the oxide layer is etched.

24. The method of claim 18, wherein the metal-containing gas includes carbonyl or a metal fluoride.

25. The method of claim 24, wherein the metal fluoride is tungsten hexafluoride.

\* \* \* \* \*